US012772659B2

(12) United States Patent
Kang et al.

(10) Patent No.: US 12,772,659 B2
(45) Date of Patent: Oct. 20, 2026

(54) DISPLAY APPARATUS INCLUDING TRANSMISSION AREA HAVING IMPROVED TRANSMITTANCE AND METHOD OF MANUFACTURING THE SAME

(71) Applicant: SAMSUNG DISPLAY CO., LTD., Yongin-si (KR)

(72) Inventors: Hoon Kang, Yongin-si (KR); Taewook Kang, Yongin-si (KR); Heekyun Shin, Yongin-si (KR); Sanghyun Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 370 days.

(21) Appl. No.: 18/480,493

(22) Filed: Oct. 3, 2023

(65) Prior Publication Data

US 2024/0032326 A1 Jan. 25, 2024

Related U.S. Application Data

(62) Division of application No. 17/353,378, filed on Jun. 21, 2021, now Pat. No. 11,785,799.

(30) Foreign Application Priority Data

Sep. 17, 2020 (KR) ........................ 10-2020-0120020

(51) Int. Cl.

| | |
|---|---|
| ***H10K 59/121*** | (2023.01) |
| ***H10K 59/65*** | (2023.01) |
| ***H10K 59/80*** | (2023.01) |

(52) U.S. Cl.

CPC ....... *H10K 59/121* (2023.02); *H10K 59/8731* (2023.02); *H10K 59/65* (2023.02)

(58) Field of Classification Search

CPC .. H10K 59/121; H10K 59/8731; H10K 59/65; H10K 59/124; H10K 77/111;

(Continued)

(56) References Cited

U.S. PATENT DOCUMENTS

| | | | | |
|---|---|---|---|---|
| 7,903,210 | B2 * | 3/2011 | Sugiura | G02F 1/133553 349/114 |
| 9,082,668 | B2 * | 7/2015 | Kim | H10K 59/8791 |

(Continued)

FOREIGN PATENT DOCUMENTS

| | | |
|---|---|---|
| CN | 107851407 A | 3/2018 |
| CN | 109192076 A | 1/2019 |

(Continued)

*Primary Examiner* — Caleb E Henry

(74) *Attorney, Agent, or Firm* — Womble Bond Dickinson (US) LLP

(57) ABSTRACT

Provided are a display apparatus and a method of manufacturing the display apparatus. The display apparatus includes a first barrier layer including a first display area, a second display area including transmission areas, and a non-display area, a first base layer on a lower surface of the first barrier layer, and defining a first opening that overlaps the second display area, a second base layer on an upper surface of the first barrier layer, and defining second openings that respectively overlap the transmission areas, a second barrier layer on an upper surface of the second base layer and defining third openings that overlap the second openings, main pixel electrodes over the second barrier layer in the first display area, and auxiliary pixel electrodes over the second barrier layer in the second display area.

7 Claims, 16 Drawing Sheets

(58) Field of Classification Search
CPC ........... H10K 2102/311; H10K 59/131; H10K 50/81; H10K 50/82; H10K 77/10; H10K 50/8426; H10K 59/1201; H10K 71/00; H10K 59/873; H10K 2102/351; H10K 71/16; H10K 71/231; H10K 59/352; H10K 59/122; H10K 50/856; H10K 50/824; H10K 59/38; H10K 59/123; Y02E 10/549; H10D 86/411; H01L 51/5271; H01L 27/3246; H01L 51/5228; H01L 51/56; H01L 27/322
See application file for complete search history.

(56) References Cited

U.S. PATENT DOCUMENTS

| | | | | |
|---|---|---|---|---|
| 10,290,832 | B2* | 5/2019 | Ueda | H10K 59/122 |
| 10,319,944 | B2* | 6/2019 | Lee | H10K 59/123 |
| 10,454,067 | B2 | 10/2019 | Seo et al. | |
| 10,497,903 | B2* | 12/2019 | Ueda | H10K 59/80522 |
| 10,826,023 | B2* | 11/2020 | Ueda | H10K 59/122 |
| 10,854,690 | B2 | 12/2020 | Bae et al. | |
| 11,139,451 | B2 | 10/2021 | Choi et al. | |
| 11,335,753 | B2 | 5/2022 | Ding et al. | |
| 11,563,198 | B2* | 1/2023 | Ueda | H10K 59/80522 |
| 11,785,799 | B2* | 10/2023 | Kang | H10K 59/121 257/40 |
| 12,349,541 | B2* | 7/2025 | Park | H10D 86/443 |
| 2009/0009069 | A1* | 1/2009 | Takata | H10K 59/122 445/24 |
| 2014/0151651 | A1* | 6/2014 | Jin | H10K 59/123 438/23 |
| 2015/0097168 | A1* | 4/2015 | Hanawa | H10K 59/121 257/40 |
| 2016/0293687 | A1 | 10/2016 | Chang et al. | |
| 2016/0293878 | A1* | 10/2016 | Maruyama | H10K 59/80522 |
| 2017/0288174 | A1* | 10/2017 | Ueda | H10K 50/856 |
| 2018/0210306 | A1 | 7/2018 | Okabe et al. | |
| 2019/0051859 | A1* | 2/2019 | Choi | H10K 59/8731 |
| 2019/0074479 | A1* | 3/2019 | Lee | H10K 59/873 |
| 2019/0129269 | A1* | 5/2019 | Ogawa | G02F 1/133553 |
| 2019/0148672 | A1* | 5/2019 | Seo | H10K 59/60 257/40 |
| 2019/0229293 | A1* | 7/2019 | Ueda | H10K 59/122 |
| 2019/0245159 | A1* | 8/2019 | Kim | H10K 59/8722 |
| 2019/0288047 | A1* | 9/2019 | Jeong | H10K 77/10 |
| 2019/0334120 | A1* | 10/2019 | Seo | H10K 59/40 |
| 2019/0341440 | A1* | 11/2019 | Cha | G09G 3/3266 |
| 2020/0052051 | A1* | 2/2020 | Lee | H10D 86/451 |
| 2020/0064968 | A1* | 2/2020 | Kim | G06F 3/0443 |
| 2020/0083483 | A1* | 3/2020 | Ueda | H10K 59/80522 |
| 2020/0091256 | A1* | 3/2020 | Kim | H10K 59/122 |
| 2020/0106045 | A1* | 4/2020 | Han | H10D 86/451 |
| 2020/0119304 | A1* | 4/2020 | Choi | H10K 59/8731 |
| 2020/0161582 | A1* | 5/2020 | Choi | H10K 59/121 |
| 2020/0176538 | A1* | 6/2020 | Um | H10K 59/126 |
| 2020/0185638 | A1* | 6/2020 | Choi | H10K 59/38 |
| 2020/0203671 | A1* | 6/2020 | Yug | H10K 77/10 |
| 2020/0258947 | A1* | 8/2020 | Chung | H10K 59/1201 |
| 2020/0273927 | A1* | 8/2020 | Oh | H10K 59/121 |
| 2020/0310180 | A1* | 10/2020 | Fu | G02F 1/13439 |
| 2020/0313101 | A1* | 10/2020 | Jung | H10K 77/10 |
| 2021/0013451 | A1* | 1/2021 | Ueda | H10K 59/80522 |
| 2021/0083023 | A1* | 3/2021 | Zheng | H10K 59/131 |
| 2021/0104705 | A1* | 4/2021 | Kim | H10K 59/871 |
| 2021/0175303 | A1* | 6/2021 | Bang | H10K 59/122 |
| 2021/0234122 | A1* | 7/2021 | Choi | H02P 11/04 |
| 2021/0241671 | A1* | 8/2021 | Lee | G09G 3/3225 |
| 2021/0249492 | A1* | 8/2021 | Choi | H10K 59/1213 |
| 2021/0273029 | A1* | 9/2021 | Bang | H10K 59/122 |
| 2022/0140293 | A1* | 5/2022 | Xia | H10K 59/8792 257/89 |
| 2022/0209194 | A1* | 6/2022 | Kim | H10K 59/122 |
| 2022/0320472 | A1* | 10/2022 | Tabatake | H10K 59/131 |
| 2022/0352271 | A1 | 11/2022 | Lee et al. | |
| 2023/0083513 | A1* | 3/2023 | Ueda | H10K 59/878 257/40 |
| 2023/0128710 | A1 | 4/2023 | Choi et al. | |

FOREIGN PATENT DOCUMENTS

| | | | |
|---|---|---|---|
| CN | 109860266 | A | 6/2019 |
| CN | 109949711 | A | 6/2019 |
| CN | 110071121 | A | 7/2019 |
| CN | 110783347 | A | 2/2020 |
| CN | 111599838 | A | 8/2020 |
| KR | 10-2019-0056473 | A | 5/2019 |
| KR | 10-2020-0060594 | A | 6/2020 |
| KR | 10-2020-0099251 | A | 8/2020 |

* cited by examiner

DISPLAY APPARATUS INCLUDING TRANSMISSION AREA HAVING IMPROVED TRANSMITTANCE AND METHOD OF MANUFACTURING THE SAME

CROSS-REFERENCE TO RELATED APPLICATIONS

This application is a divisional of U.S. patent application Ser. No. 17/353,378, filed Jun. 21, 2021, which claims priority to and the benefit of Korean Patent Application No. 10-2020-0120020, filed Sep. 17, 2020, the entire content of both of which is incorporated herein by reference.

BACKGROUND

1. Field

One or more embodiments relate to a display apparatus including a transmission area having improved transmittance, and a method of manufacturing the display apparatus.

2. Description of the Related Art

Applications of conventional display apparatuses have diversified. Moreover, because display apparatuses have become thinner and lighter, their range of use has increased.

The area occupied by a display area of a display apparatus has been increased, and also various functions that may be applied to, or linked to, the display apparatus have been added to the display apparatus. To increase the area occupied by a display area and also add various functions, research has been carried out on display apparatuses having, within a display area, an area for adding various functions other than image display.

SUMMARY

One or more embodiments include a display apparatus including a transmission area having improved transmittance as an area for adding various functions within a display area, and a method of manufacturing the display apparatus. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure According to one or more embodiments, a display apparatus includes a first barrier layer including a first display area, a second display area including transmission areas, and a non-display area, a first base layer on a lower surface of the first barrier layer, and defining a first opening that overlaps the second display area, a second base layer on an upper surface of the first barrier layer, and defining second openings that respectively overlap the transmission areas, a second barrier layer on an upper surface of the second base layer and defining third openings that overlap the second openings, main pixel electrodes over the second barrier layer in the first display area, and auxiliary pixel electrodes over the second barrier layer in the second display area.

The display apparatus may further include a first auxiliary opposite electrode over the auxiliary pixel electrodes, overlapping the auxiliary pixel electrodes, and defining fourth openings overlapping with the transmission areas.

Respective inner lateral surfaces of the third openings may protrude more inwardly than respective inner lateral surfaces of the second openings.

As viewed in a direction perpendicular to the upper surface of the first barrier layer, an area of each of the third openings may be less than an area of each of the second openings.

The display apparatus may further include second auxiliary opposite electrodes on the first barrier layer to correspond to the fourth openings.

The second auxiliary opposite electrodes may each have the same layer structure as the first auxiliary opposite electrode.

The display apparatus may further include a main opposite electrode over the main pixel electrodes, overlapping the main pixel electrodes, and integral with the first auxiliary opposite electrode.

The display apparatus may further include a transparent layer on the lower surface of the first barrier layer in the first opening.

The display apparatus may further include an encapsulation layer that covers the main pixel electrodes, the auxiliary pixel electrodes, respective inner lateral surfaces of the third openings, and respective inner lateral surfaces of the second openings.

The encapsulation layer may include a first inorganic encapsulation layer, an organic encapsulation layer, and a second inorganic encapsulation layer.

The display apparatus may further include main thin-film transistors on the second barrier layer in the first display area, electrically connected to the main pixel electrodes, and each including a main semiconductor layer and a main gate electrode, and auxiliary thin-film transistors on the second barrier layer in the second display area, electrically connected to the auxiliary pixel electrodes, and each including an auxiliary semiconductor layer and an auxiliary gate electrode.

The display apparatus may further include main thin-film transistors on the second barrier layer in the first display area, electrically connected to the main pixel electrodes, and each including a main semiconductor layer and a main gate electrode, auxiliary thin-film transistors on the second barrier layer in the non-display area, and each including an auxiliary semiconductor layer and an auxiliary gate electrode, and connection lines configured to electrically connect the auxiliary thin-film transistors to the auxiliary pixel electrodes.

The first base layer may include an opaque material.

According to one or more embodiments, a method of manufacturing a display apparatus includes forming main pixel electrodes over a second barrier layer of a first display area of a substrate, the substrate having a first barrier layer, a first base layer on a lower surface of the first barrier layer, a second base layer on an upper surface of the first barrier layer, and the second barrier layer on an upper surface of the second base layer, forming auxiliary pixel electrodes over the second barrier layer between transmission areas in a second display area of the substrate, forming second openings in the second base layer that overlap the transmission areas, forming third openings in the second barrier layer that overlap the second openings, and forming a first opening in the first base layer that overlaps the second display area.

The forming the first opening may include applying laser energy to a lower surface of the first base layer.

The method may further include forming a main opposite electrode overlapping the main pixel electrodes, over the main pixel electrodes, and forming a first auxiliary opposite electrode overlapping the auxiliary pixel electrodes, and defining fourth openings overlapping the transmission areas, over the auxiliary pixel electrodes.

Respective inner lateral surfaces of the third openings protrude inwardly more than respective inner lateral surfaces of the second openings.

As viewed in a direction perpendicular to the upper surface of the first barrier layer, an area of each of the third openings may be less than an area of each of the second openings.

The method may further include forming an encapsulation layer that covers the main pixel electrodes, the auxiliary pixel electrodes, respective inner lateral surfaces of the third openings, and respective inner lateral surfaces of the second openings.

The first base layer may include an opaque material.

These and/or other aspects will become apparent and more readily appreciated from the following description of the embodiments, the claims, and the accompanying drawings.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
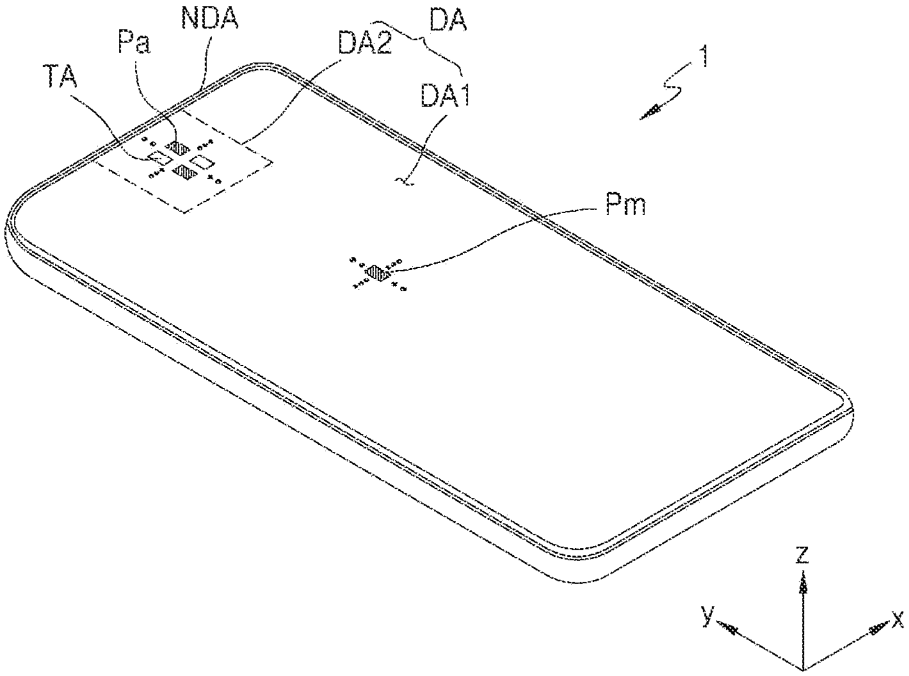
FIGS. 1A and 1B are schematic perspective views of a display apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as “beneath,” “below,” “lower,” “under,” “above,” “upper,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
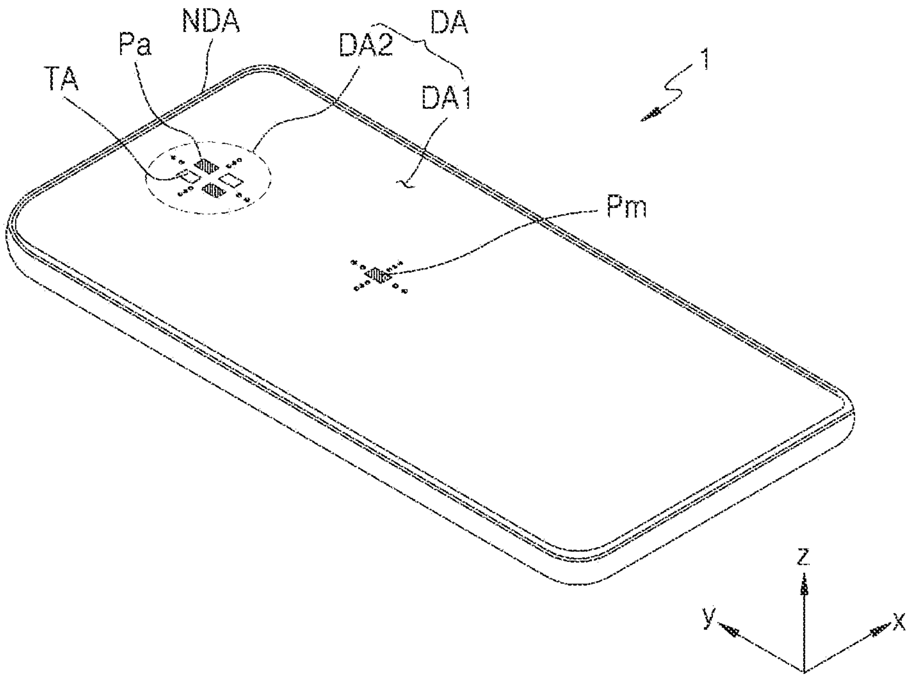

FIGS. 1A and 1B are schematic perspective views of a display apparatus 1 according to some embodiments.

Referring to FIG. 1A, the display apparatus 1 may include a display area DA, and a non-display area NDA outside the display area DA. The display area DA may include a second display area DA2, and a first display area DA1 surrounding at least a portion of the second display area DA2. The second display area DA2 displays an auxiliary image, and the first display area DA1 displays a main image, and thus the second display area DA2 and the first display area DA1 may display images individually or together. The non-display area NDA might not include display devices. The display area DA may be entirely surrounded by the non-display area NDA. The display apparatus 1 having the first display area DA1, the second display area DA2, and the non-display area NDA may be understood as a substrate 100 (see FIG. 2) of the display apparatus 1 having the first display area DA1, the second display area DA2, and the non-display area NDA.

FIG. 1A illustrates that the first display area DA1 surrounds at least a portion of one second display area DA2. In other words, one edge (e.g., an outer edge, or a portion thereof) of the second display area DA2 may be consistent with one edge (e.g., an inner edge, or a portion thereof) of the first display area DA1. According to other embodiments, the display apparatus 1 may have two or more second display areas DA2, and the two or more second display areas DA2 may have different shapes and different sizes. When viewed in a direction that is approximately perpendicular to an upper surface of the display apparatus 1, the second display area DA2 may have any of various shapes, such as a circular shape, an oval shape, a polygonal shape (e.g., a rectangular shape), a star shape, or a diamond shape.

FIG. 1A illustrates that, when viewed in the direction approximately perpendicular to the upper surface of the display apparatus 1, the second display area DA2 is arranged at a center of an upper portion (in a +y direction) of the first display area DA1 having an approximately rectangular shape. However, other embodiments are not limited thereto, and the second display area DA2 may be arranged at one side of the first display area DA1, for example, a right upper side or left upper side thereof, or may be arranged within the first display area DA1 to be entirely surrounded by the first display area DA1. For example, as shown in FIG. 1B, the second display area DA2 having a circular shape may be located within the first display area DA1.

The display apparatus 1 may include a plurality of main subpixels Pm arranged in the first display area DA1 and a plurality of auxiliary subpixels Pa arranged in the second display area DA2.

The display apparatus 1 may include a component 40 (see FIG. 2), which is an electronic device located below a display panel in correspondence with the second display area DA2. The component 40 may be an electronic device that uses light or sounds. For example, the electronic device may be a sensor that measures a distance, such as a proximity sensor, may be a sensor that recognizes a portion of the body of a user, such as a fingerprint, an iris, or a face, may be a small lamp that outputs light, or may be an image sensor that captures an image, such as a camera.

The electronic device using light may use light in various wavelength bands, such as visible light, infrared light, and/or ultraviolet light. The electronic device using sounds may use ultrasonic waves or sounds of other frequency bands. According to some embodiments, the component 40 includes sub-components, like a light emitter and/or a light receiver. The light emitter and the light receiver may be integrated with each other, or may be physically separated from each other such that a pair of a light emitter and a light receiver may constitute one component 40. To reduce or minimize restrictions on the function of the component 40, the second display area DA2 may include transmission areas TA capable of transmitting light and/or sound that is output from the component 40 to the outside, or that travels from the outside toward the component 40.

A plurality of auxiliary subpixels Pa may be arranged in the second display area DA2. Each of the auxiliary subpixels Pa may emit light to provide a certain image. An image displayed by the second display area DA2 is an auxiliary image, and thus may have lower resolution than an image displayed by the first display area DA1. In other words, when the second display area DA2 includes the transmission areas TA capable of transmitting light and sound, and when no subpixels are arranged in the transmission areas TA, the number of auxiliary subpixels Pa arranged on a unit area in the second display area DA2 may be less than the number of main subpixels Pm arranged on a unit area in the first display area DA1.

An organic light-emitting display apparatus will now be illustrated and described as the display apparatus 1 according to some embodiments. However, display apparatuses according to other embodiments are not limited thereto. In other words, the display apparatus 1 according to some embodiments may be an inorganic light-emitting display, a quantum dot light-emitting display, or the like. For example, an emission layer of a display device included in the display apparatus 1 may include an organic material or may include an inorganic material. The display apparatus 1 may include quantum dots, may include an organic material and quantum dots, or may include an inorganic material and quantum dots.

Figure 2:
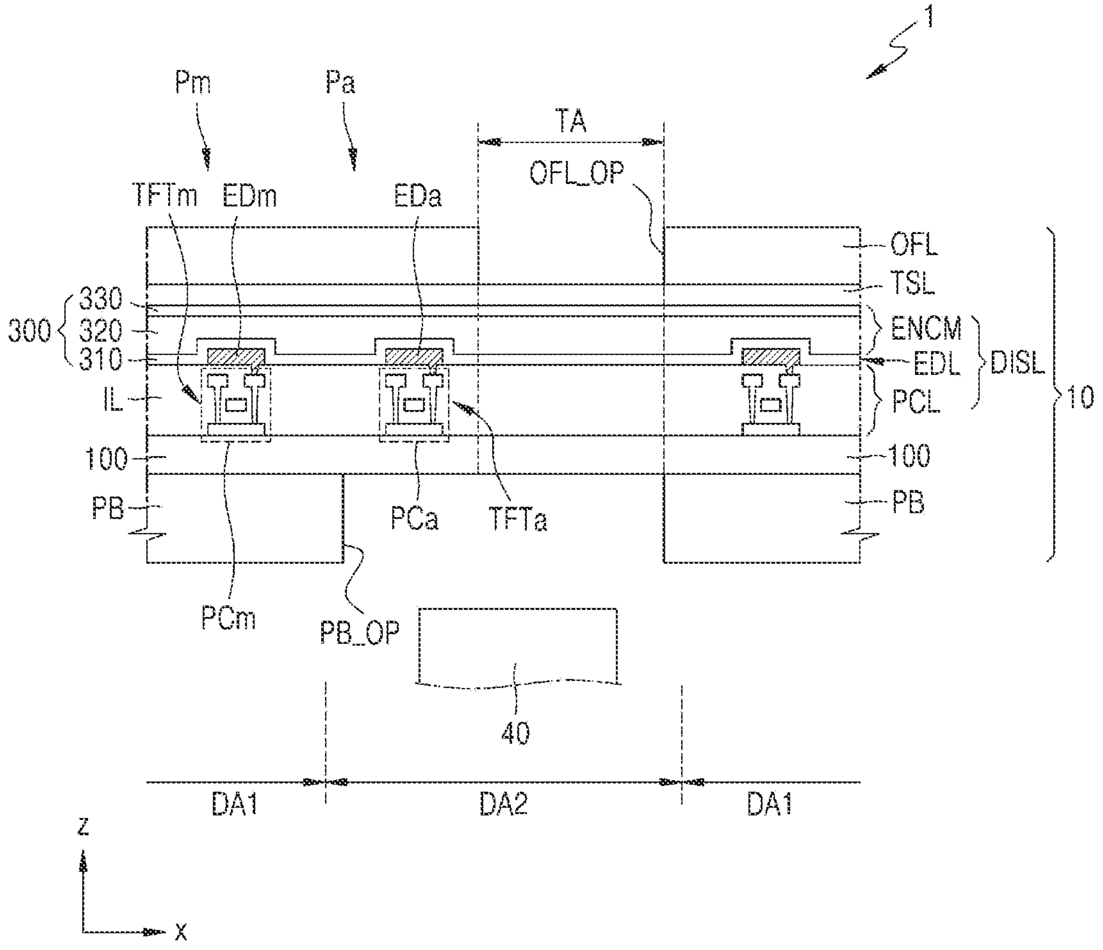
FIG. 2 is a schematic cross-sectional view of a portion of a display apparatus according to some embodiments.

FIG. 2 is a schematic cross-sectional view of a portion of the display apparatus 1 according to some embodiments. Referring to FIG. 2, the display apparatus 1 may include a display panel 10, and a component 40 overlapped by the display panel 10. The display apparatus 1 may further include a cover window arranged above the display panel 10 to protect the display panel 10 in some embodiments.

The display panel 10 includes a second display area DA2 overlapping the component 40, and a first display area DA1 on which a main image is displayed. The display panel 10 may include a substrate 100, a display layer DISL on the substrate 100, a functional layer above the display layer DISL, and a panel protection member PB below the substrate 100. Although a touch screen layer TSL and an optical functional layer OFL are illustrated as an example of the functional layer in FIG. 2, embodiments are not limited thereto. According to design, various functional layers may be arranged.

The display layer DISL may include a circuit layer PCL, a display device layer EDL, and an encapsulation member ENCM. The circuit layer PCL may include thin-film transistors TFTm and TFTa. The display device layer EDL may include main and auxiliary light-emitting devices EDm and EDa, which are display devices. The encapsulation member ENCM may include an encapsulation layer 300, or may include an encapsulation substrate in some embodiments. An insulating layer IL may be arranged within the display layer DISL or the like.

The substrate 100 may include an insulative material, such as glass, quartz, and/or polymer resin. The substrate 100 may be a rigid substrate, or may be a flexible substrate that is bendable, foldable, or rollable.

The main light-emitting device EDm, and a main pixel circuit PCm electrically connected thereto, may be arranged in the first display area DA1 of the display panel 10. The main pixel circuit PCm may include at least one thin-film transistor TFTm, and may control an operation of the main light-emitting device EDm. A main subpixel Pm may include the main light-emitting device EDm.

The auxiliary light-emitting device EDa, and an auxiliary pixel circuit PCa electrically connected thereto, may be arranged in the second display area DA2 of the display panel 10. The auxiliary pixel circuit PCa may include at least one thin-film transistor TFTa, and may control an operation of the auxiliary light-emitting device EDa. The auxiliary subpixel Pa may include the auxiliary light-emitting device EDa.

A region of the second display area DA2 where the auxiliary light-emitting device EDa is arranged may be defined as an auxiliary display area, and a region of the second display area DA2 where no auxiliary light-emitting devices EDa are arranged may be defined as the transmission area TA.

The transmission area TA may transmit a light/signal emitted by the component 40, which is arranged to correspond to the second display area DA2, or may transmit a light/signal incident upon the component 40. Auxiliary light-emitting devices EDa and transmission areas TA may alternate with each other in the second display area DA2. In other words, each of the auxiliary light-emitting devices EDa may be between respective transmission areas TA in the second display area DA2.

The display device layer EDL may be covered with the encapsulation layer 300, as shown in FIG. 2. For example, the encapsulation layer 300 may include at least one inorganic encapsulation layer and at least one organic encapsulation layer, as shown in FIG. 2. FIG. 2 illustrates the encapsulation layer 300 including a first inorganic encapsulation layer 310, a second inorganic encapsulation layer 330, and an organic encapsulation layer 320 between the first and second inorganic encapsulation layers 310 and 330.

The first and second inorganic encapsulation layers 310 and 330 may include at least one inorganic insulating material, such as silicon oxide ($SiO_2$), silicon nitride (SiNx), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$), and may be formed by chemical vapor deposition (CVD) or the like. The organic encapsulation layer 320 may include a polymer-based material. Examples of the polymer-based material may include a silicon-based resin, an acryl-based resin (e.g., polymethyl methacrylate, polyacrylic acid, or the like), an epoxy-based resin, polyimide, and polyethylene. The first inorganic encapsulation layer 310, the organic encapsulation layer 320, and the second inorganic encapsulation layer 330 may each be integrally formed to cover the first display area DA1 and the second display area DA2.

However, embodiments are not limited thereto, and the display panel 10 may include an encapsulation substrate above the display device layer EDL. In this case, the encapsulation substrate may be arranged to face the substrate 100 with the display device layer EDL therebetween. A gap may exist between the encapsulation substrate and the display device layer EDL. The encapsulation substrate may include glass. A sealant including frit or the like may be between the substrate 100 and the encapsulation substrate, and may be arranged in the non-display area NDA. The sealant arranged in the non-display area NDA may surround the display area DA, and may reduce or prevent the permeation of moisture through the side surfaces of the display panel 10.

The touch screen layer TSL may obtain coordinate information based on an external input, for example, a touch event. The touch screen layer TSL may include a touch electrode, and touch wires connected to the touch electrode. The touch screen layer TSL may sense an external input according to a self-capacitance method or a mutual capacitance method.

The touch screen layer TSL may be on the encapsulation layer 300. Alternatively, the touch screen layer TSL may be separately provided on a touch substrate, and then may be coupled to the upper surface of the encapsulation layer 300 via an adhesive layer, such as an optically clear adhesive (OCA). According to some embodiments, the touch screen layer TSL may be provided directly on the encapsulation layer 300. In this case, there might be no adhesive layers between the touch screen layer TSL and the encapsulation layer 300.

The optical functional layer OFL may include an anti-reflection layer. The anti-reflection layer may reduce reflectivity of light (external light) that is incident from an external source toward the display apparatus 1. For example, the optical functional layer OFL may be a polarization film. The optical functional layer OFL may have an opening OFL_OP corresponding to the transmission area TA such that the light transmittance of the transmission area TA may significantly improve. The opening OFL_OP may be filled with a transparent material, such as an optically clear resin (OCR). Alternatively, the optical functional layer OFL may be implemented using a filter plate including a black matrix and color filters.

The panel protection member PB may be attached to a lower surface of the substrate 100, and may support and protect the substrate 100. The panel protection member PB may have an opening PB_OP corresponding to the second display area DA2. The panel protection member PB may improve the light transmittance of the second display area DA2 by including the opening PB_OP. The panel protection member PB may include polyethylene terephthalate (PET) or polyimide (PI). According to some embodiments, the panel protection member PB may have no openings PB_OP. The panel protection member PB may be omitted in other embodiments.

The second display area DA2 may have a larger area than an area where the component 40 is arranged. Accordingly, the area of the opening PB_OP included in the panel protection member PB might not be identical with the area of the second display area DA2. Although the component 40 is located on one side (in a −z direction) of the display panel 10 to be spaced apart from the display panel 10 in FIG. 2, at least a portion of the component 40 may be inserted into the opening PB_OP included in the panel protection member PB.

A plurality of components 40 may be arranged in the second display area DA2. In this case, the plurality of components 40 may perform different functions. For example, the plurality of components 40 may include at least two of a camera (imaging device), a solar cell, a flash, a proximity sensor, an illuminance sensor, and an iris sensor.

Figure 3:
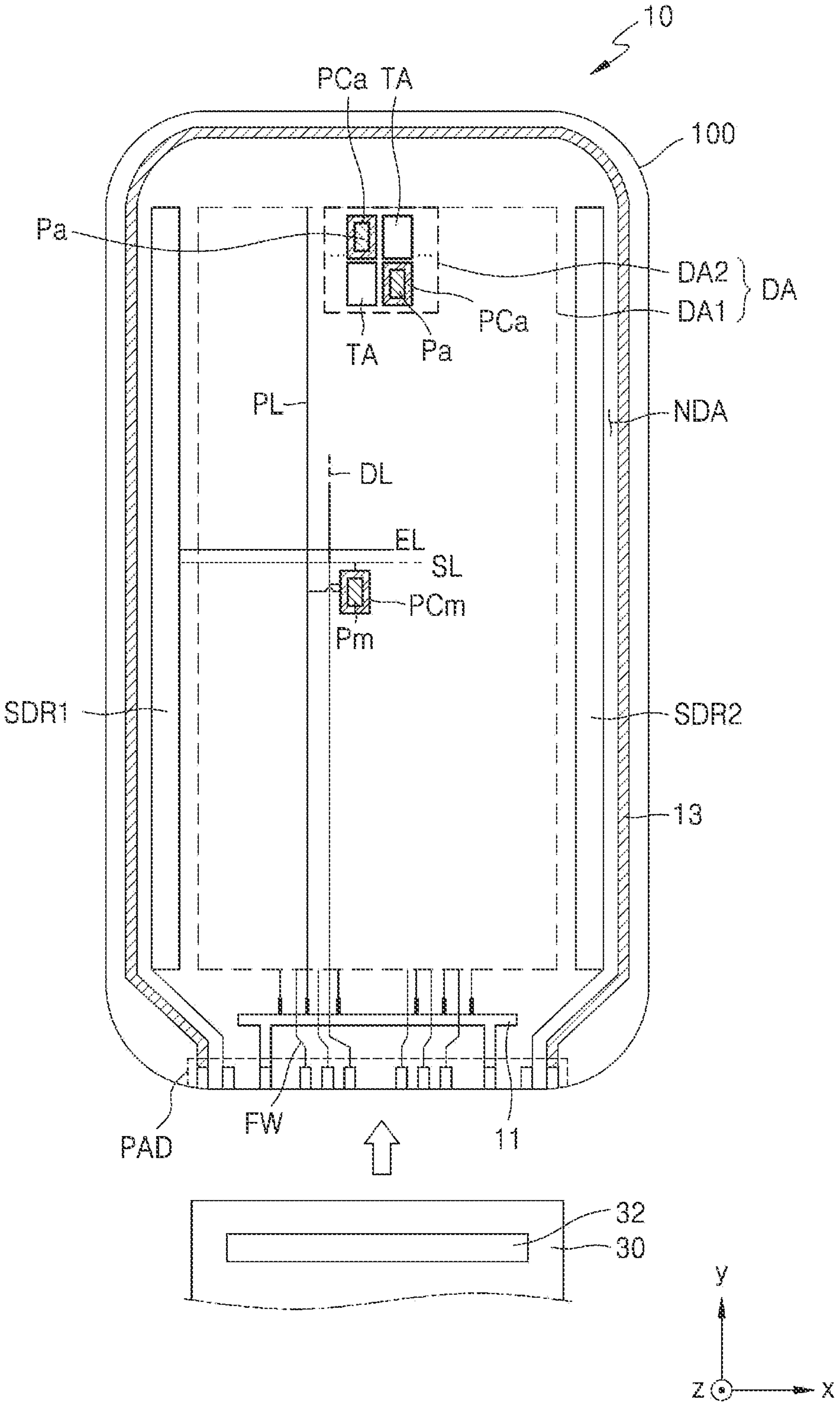
FIG. 3 is a schematic plan view of a display panel included in a display apparatus, according to some embodiments.

FIG. 3 is a schematic plan view of a display panel 10 included in a display apparatus 1 as described above. Referring to FIG. 3, various components that constitute the display panel 10 are arranged on the substrate 100.

A plurality of main subpixels Pm are arranged in the first display area DA1. Each of the main subpixels Pm may be implemented using a display device, such as an organic light-emitting diode OLED. The main pixel circuit PCm that drives the main subpixel Pm may be arranged in the first display area DA1, and may be overlapped by the main subpixel Pm. Each of the main subpixels Pm may emit, for example, red light, green light, blue light, or white light. The first display area DA1 may be covered with an encapsulation member, and thus may be protected from ambient air, moisture, or the like.

The second display area DA2 may be located at one side of the first display area DA1 as described above, or may be arranged within the display area DA and surrounded by the first display area DA1. A plurality of auxiliary subpixels Pa are arranged in the second display area DA2. Each of the auxiliary subpixels Pa may be implemented as a display device, such as an organic light-emitting diode OLED. The auxiliary pixel circuit PCa that drives the auxiliary subpixel Pa may be arranged in the second display area DA2, and may be overlapped by the auxiliary subpixel Pa. Each of the auxiliary subpixels Pa may emit, for example, red light, green light, blue light, or white light. The second display area DA2 may be protected from ambient air or moisture by being covered by the encapsulation member, together with the first display area DA1.

As described above, the second display area DA2 may include transmission areas TA. Each of the transmission areas TA may be arranged to surround, or to be adjacent to, the plurality of auxiliary subpixels Pa. Alternatively, the transmission areas TA may be arranged in a lattice configuration, together with the plurality of auxiliary subpixels Pa. Because the second display area DA2 has the transmission areas TA, a resolution of the second display area DA2 may be lower than a resolution of the first display area DA1. For example, the resolution of the second display area DA2 may be about one of ½, ⅜, ⅓, ¼, 2/9, ⅛, 1/9, or 1/16 of the resolution of the first display area DA1.

Main and auxiliary pixel circuits PCm and PCa that respectively drive the main and auxiliary subpixels Pm and Pa may be electrically connected to outer circuits arranged in the non-display area NDA, respectively. A first scan driving circuit SDR1, a second scan driving circuit SDR2, a terminal unit PAD, a driving voltage supply line 11, and a common voltage supply line 13 may be arranged in the non-display area NDA.

The first scan driving circuit SDR1 and the second scan driving circuit SDR2 may be symmetrically arranged about the first display area DA1. The first scan driving circuit SDR1 and the second scan driving circuit SDR2 may apply a scan signal, via a scan line SL, to each of the main pixel circuits PCm that drive the main subpixels Pm. The first scan driving circuit SDR1 and the second scan driving circuit SDR2 may apply a light-emission control signal to each pixel circuit via a light-emission control line EL. Some of the main pixel circuits PCm of the main subpixels Pm of the first display area DA1 may be electrically connected to the first scan driving circuit SDR1, and the remaining main pixel circuits may be electrically connected to the second scan driving circuit SDR2.

The terminal unit PAD may be on one side of the substrate 100. The terminal unit PAD may be exposed without being covered by an insulating layer, and may be electrically connected to a display circuit board 30. A display driving unit 32 may be on the display circuit board 30.

The display driving unit 32 may generate a control signal that is transmitted to the first scan driving circuit SDR1 and the second scan driving circuit SDR2. The display driving unit 32 may generate a data signal, and the generated data signal may be transmitted to the main pixel circuits via fanout wires FW and data lines DL connected to the fanout wires FW.

The display driving unit 32 may supply a driving voltage ELVDD to the driving voltage supply line 11, and may supply a common voltage ELVSS to the common voltage supply line 13. The driving voltage ELVDD may be applied to the pixel circuits of the main and auxiliary subpixels Pm and Pa via a driving voltage line PL connected to the driving voltage supply line 11, and the common voltage ELVSS may be connected to the common voltage supply line 13 and thus may be applied to an opposite electrode of each display element.

The driving voltage supply line 11 may extend in the x direction, and may be located below the first display area DA1. The common voltage supply line 13 may have a loop shape of which one side is open, and may surround, or partially surround, a portion of the first display area DA1.

Although FIG. 3 illustrates a single second display area DA2, the display panel 10 may include a plurality of second display areas DA2. In this case, the plurality of second display areas DA2 may be spaced apart from one another, and a first camera may be arranged in correspondence with one second display area DA2, and a second camera may be arranged in correspondence with another second display area DA2. Alternatively, a camera may be arranged in correspondence with one second display area DA2, and an infrared (IR) camera may be arranged in correspondence with another second display area DA2. The plurality of second display areas DA2 may have different shapes and different sizes.

Figure 4:
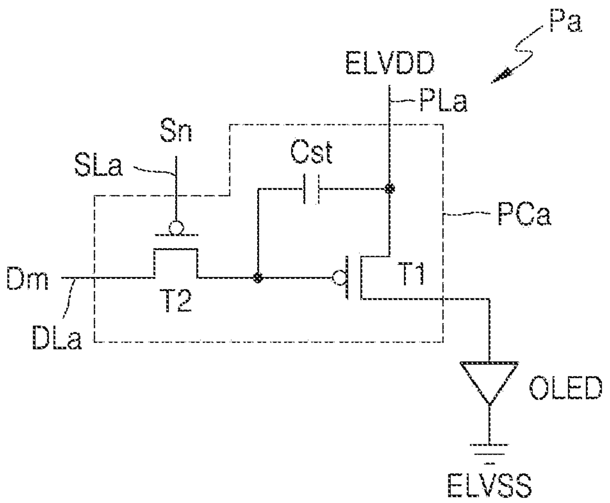
FIG. 4 is an equivalent circuit diagram of a pixel circuit included in a display apparatus, according to some embodiments.

FIG. 4 is an equivalent circuit diagram of a pixel circuit that may be included in the display apparatus 1 of FIGS. 1A and 1B. Referring to FIG. 4, an auxiliary subpixel Pa includes an auxiliary pixel circuit PCa, and an organic light-emitting diode OLED as a display device connected to the auxiliary pixel circuit PCa. A main subpixel Pm may include a main pixel circuit PCm that is the same as, or similar to, the auxiliary pixel circuit PCa of FIG. 4, and an organic light-emitting diode OLED as a display element connected to the main pixel circuit PCm.

Referring to FIG. 4, the auxiliary pixel circuit PCa includes a driving thin-film transistor T1, a switching thin-film transistor T2, and a storage capacitor Cst. The switching thin-film transistor T2 is connected to an auxiliary scan line SLa and an auxiliary data line DLa, and transmits, to the driving thin-film transistor T1, a data signal Dm received via the auxiliary data line DLa according to a scan signal Sn received via the auxiliary scan line SLa. The storage capacitor Cst is connected to the switching thin-film transistor T2 and to an auxiliary driving voltage line PLa, and stores a voltage corresponding to a difference between a voltage received from the switching thin-film transistor T2 and a driving voltage ELVDD supplied to the auxiliary driving voltage line PLa.

The driving thin-film transistor T1 is connected to the auxiliary driving voltage line PLa and the storage capacitor Cst, and may control a driving current flowing from the auxiliary driving voltage line PLa to the organic light-emitting diode OLED, in accordance with a voltage value stored in the storage capacitor Cst. The organic light-emitting diode OLED may emit light having a certain brightness due to the driving current.

Although a case where the auxiliary pixel circuit PCa includes two thin-film transistors and one storage capacitor is illustrated in FIG. 4, embodiments are not limited thereto. According to other embodiments, the auxiliary pixel circuit PCa may include seven thin-film transistors and one storage capacitor. According to other embodiments, the auxiliary pixel circuit PCa may include two or more storage capacitors.

Figure 5:
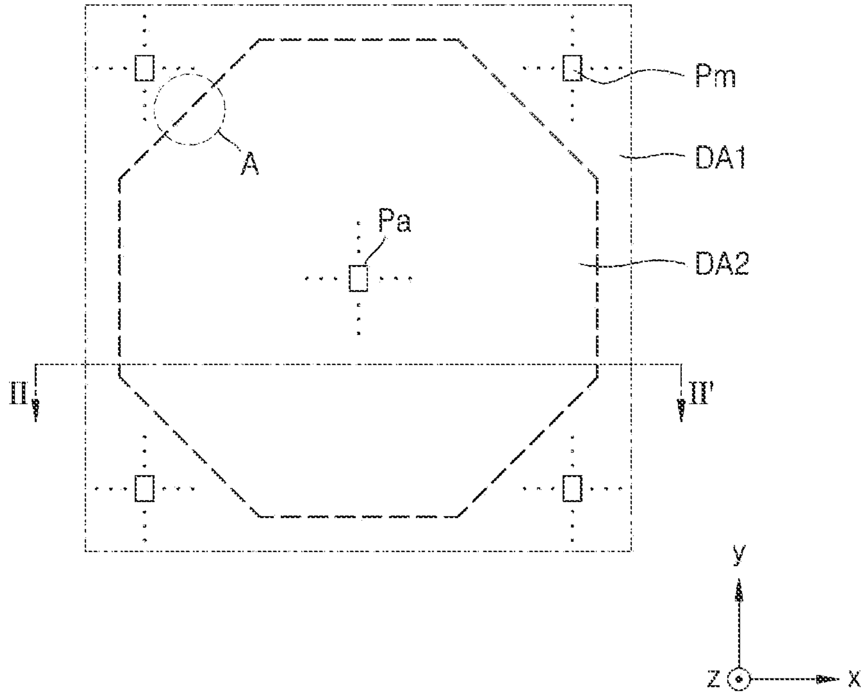
FIG. 5 is a schematic plan view of a portion of a display apparatus according to some embodiments.

FIG. 5 is a schematic plan view of a portion of a display apparatus according to some embodiments.

Referring to FIG. 5, a plurality of main subpixels Pm may be arranged in a first display area DA1, and a plurality of auxiliary subpixels Pa may be arranged in a second display area DA2. Because the component 40 is overlapped by the second display area DA2, as described above, the second display area DA2 may include a transmission area TA.

A density of the auxiliary subpixels Pa of the second display area DA2 including the transmission area TA may be different from that of the main subpixels Pm of the first display area DA1. For example, within a same unit area, the number of pixels arranged in the second display area DA2 and/or an aperture ratio thereof may be less than the number of pixels arranged in the first display area DA1 and/or an aperture ratio thereof.

Figure 6:
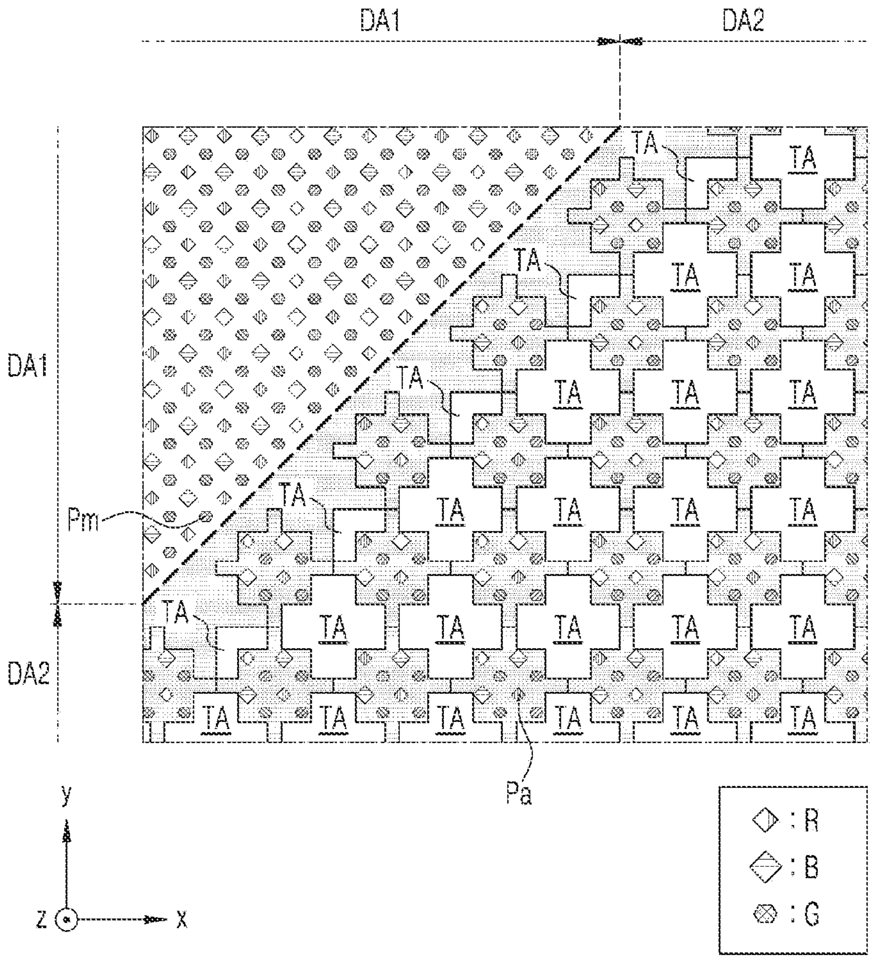
FIG. 6 is a schematic magnified plan view of a portion of a display area of a display apparatus, according to some embodiments.
Figure 7:
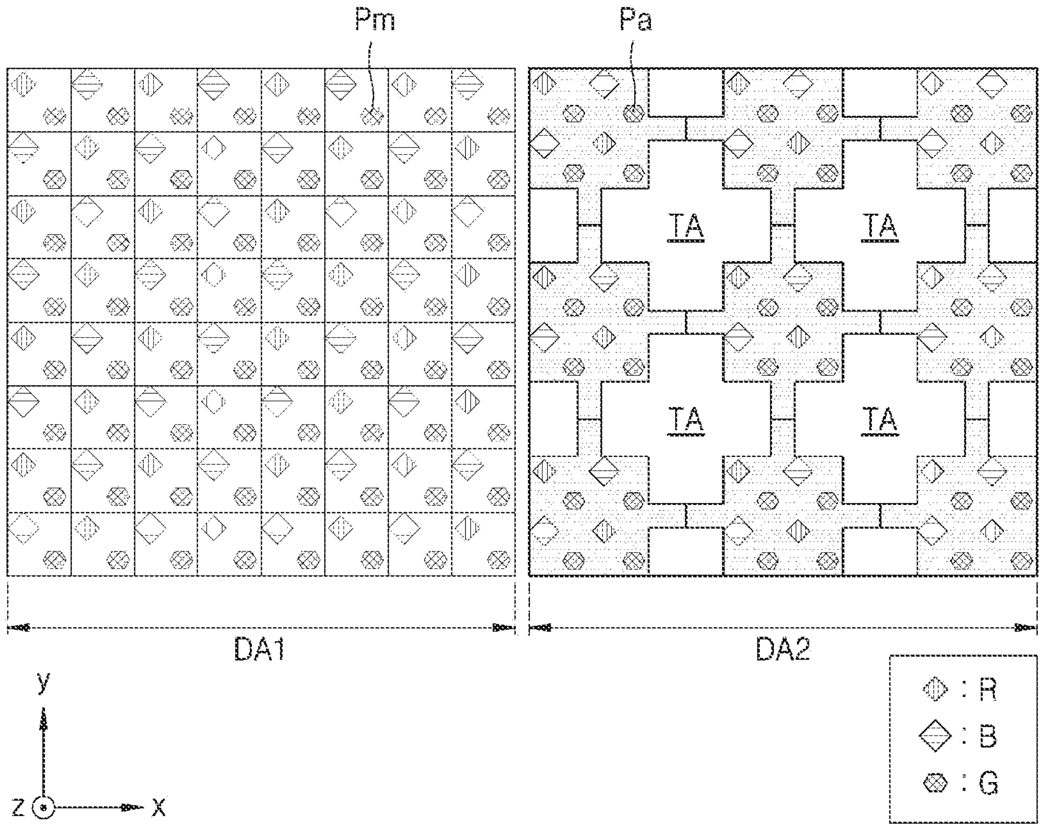
FIG. 7 is a schematic plan view of a first display area and a second display area of a display apparatus, according to some embodiments.

FIG. 6 is a schematic magnified plan view of a portion of a display area of a display apparatus according to some embodiments (e.g., may correspond to a magnified view of portion A of FIG. 5). FIG. 7 is a schematic plan view of a first display area and a second display area of the display apparatus according to some embodiments.

Referring to FIG. 6, the first display area DA1 and the second display area DA2 may be arranged adjacent to each other, and the second display area DA2 may include a plurality of transmission areas TA. A plurality of main subpixels Pm, for example, an array of main subpixels Pm, may be arranged in the first display area DA1. A plurality of auxiliary subpixels Pa, for example, an array of auxiliary subpixels Pa, may be arranged in the second display area DA2. Although FIGS. 6 and 7 illustrate an array of main subpixels Pm and an array of auxiliary subpixels Pa, other embodiments are not limited thereto. The main subpixels Pm may be arranged in various arrays, and the auxiliary subpixels Pa may be arranged in various arrays. For example, although FIGS. 6 and 7 illustrate a case wherein the main subpixels Pm and the auxiliary subpixels Pa are arranged according to the same, or a similar, rule, subpixels may be differently arranged in different display areas.

The auxiliary subpixels Pa of the second display area DA2 may include pixel groups spaced apart from one another. Each of the pixel groups may include a plurality of auxiliary subpixels Pa arranged in a certain pattern. Each transmission area TA may be between adjacent pixel groups, and may be between the first display area DA1 and a pixel group of the second display area DA2 that is closest to the first display area DA1.

A plurality of transmission areas TA may be arranged in the second display area DA2. The plurality of transmission areas TA may be between auxiliary subpixels Pa in the second display area DA2. At least a portion of each of the transmission areas TA may be surrounded by the auxiliary subpixels Pa. Although FIG. 6 illustrates a case where each of the transmission areas TA has a '+' shape in a plane view, the shape of each of the transmission areas TA is not limited thereto. For example, each of the transmission areas TA may have various shapes according to designs, such as '¡¤', '¤¤', '§ ¤', and '•¤', in a plane view. The planar area of each of the transmission areas TA may be modified variously. Approximate transmittance of the second display area DA2 may be controlled by controlling the shape, area, and arrangement of the transmission areas TA.

Figure 8:
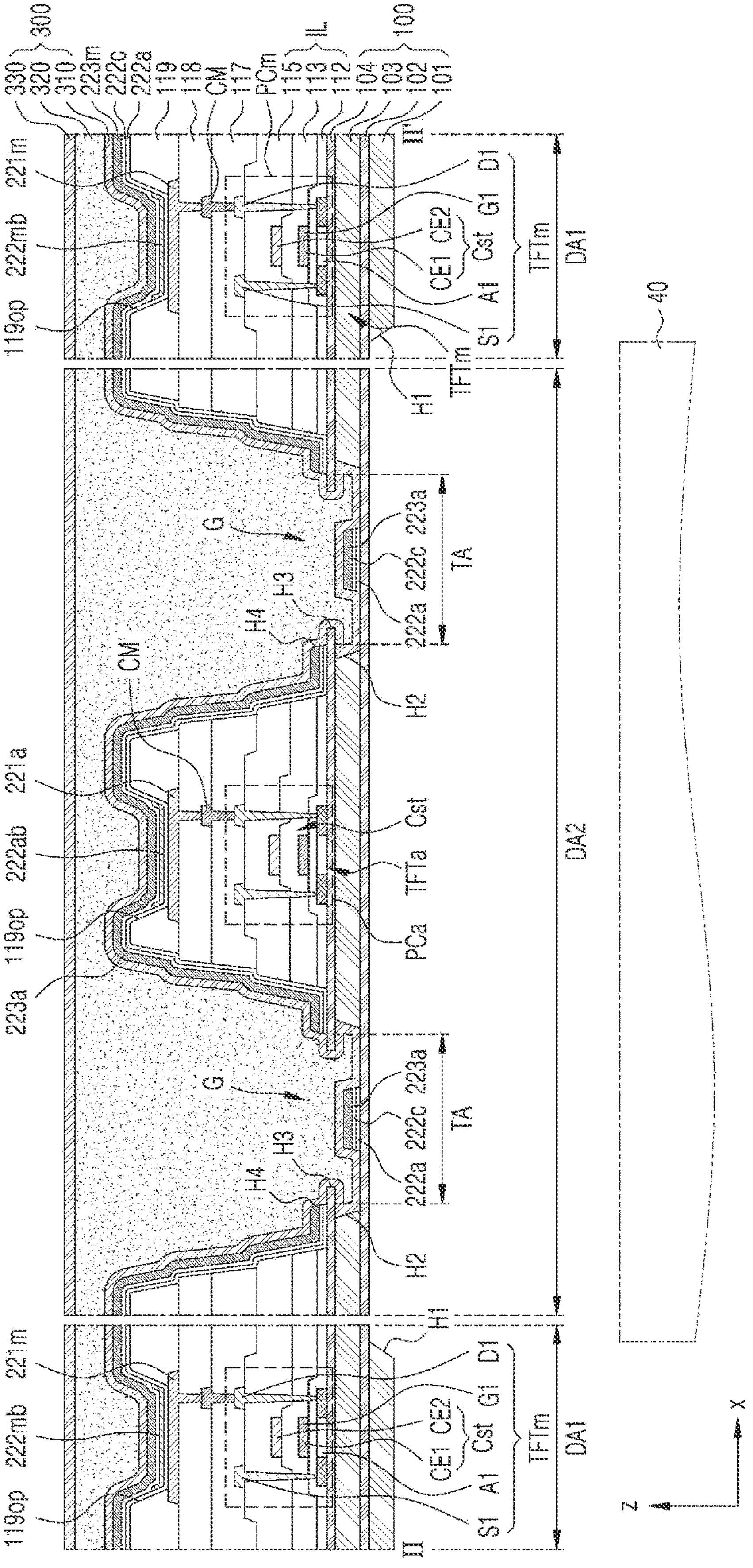
FIG. 8 is a schematic cross-sectional view of a portion of a display apparatus according to some embodiments.

FIG. 8 is a schematic cross-sectional view of a portion of a display apparatus according to some embodiments.

The substrate 100 may include various materials, as described above, and may have a multi-layer structure as shown in FIG. 8. In detail, the substrate 100 may include a first base layer 101, a first barrier layer 102, a second base layer 103, and a second barrier layer 104, which are sequentially stacked. In other words, the substrate 100 may have a first barrier layer 102, a first base layer 101 on a lower surface of the first barrier layer 102, a second base layer 103 on an upper surface of the first barrier layer 102, and a second barrier layer 104 on an upper surface of the second base layer 103.

Each of the first and second base layers 101 and 103 may include polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, cellulose triacetate, and/or cellulose acetate propionate.

According to some embodiments, polymer resin included in the first and second base layers 101 and 103 may be transparent. In other words, each of the first and second base layers 101 and 103 may include colorless polymer resin. In this case, the first base layer 101 and the second base layer 103 overlapping with the transmission areas TA include a transparent material, and thus transmittance of the transmission areas TA may improve, and relatively uniform transmittance may be provided regardless of the wavelength band of light. However, colorless polymer resin is weak to deformation, and thus dimension stability may degrade, or heat resistance may be insufficient or unsuitable due to low heat characteristics.

According to other embodiments, polymer resin included in the first and second base layers 101 and 103 may be opaque. In other words, each of the first and second base layers 101 and 103 may include colored polymer resin. In this case, the first base layer 101 and the second base layer 103 overlapping with the transmission areas TA include an opaque material, and thus transmittance of light belonging to a corresponding wavelength band may be relatively low.

According to embodiments to be described later, the display apparatus may include a first opening H1 formed in the first base layer 101, and second openings H2 formed in the second base layer 103. Accordingly, the first base layer 101 and the second base layer 103 include an opaque material (e.g., colored polymer resin), but a problem, such as transmittance degradation due to the inclusion of an opaque material, may be addressed.

In detail, the first base layer 101 may have the first opening H1 overlapping the second display area DA2. The first opening H1 may overlap the plurality of transmission areas TA and the plurality of auxiliary pixels Pa of FIG. 6 arranged in the second display area DA2. In other words, in some embodiments, no first base layers 101 may be arranged below the plurality of transmission areas TA, and the plurality of auxiliary pixels arranged in the second display area DA2.

The second base layer 103 may have the second openings H2 overlapping with the transmission areas TA included in the second display area DA2. In other words, in some embodiments, no second base layers 103 may be arranged below the transmission areas TA arranged in the second display area DA2.

Because the first base layer 101 and the second base layer 103 does not overlap with the transmission areas TA as described above, transmittance of the transmission areas TA may be improved. Because the transmittance of the transmission areas TA is not affected by the transparency of the material included in the (omitted portions of) first and second base layers 101 and 103, restrictions on selection of a material used to form the first and second base layers 101 and 103 may be reduced.

The first barrier layer 102 and the second barrier layer 104 may reduce or prevent permeation of external foreign materials. The first barrier layer 102 and the second barrier layer 104 each may be a single layer or a multi-layer including an inorganic material, such as silicon nitride, silicon oxynitride, and/or silicon oxide.

The second barrier layer 104 may have third openings H3 that overlap with the transmission areas TA. The third openings H3 of the second barrier layer 104 and the second openings H2 of the second base layer 103 overlap each other, respectively, thereby forming grooves G.

According to some embodiments, each of the grooves G may have an undercut structure (or an eave structure). Respective inner lateral surfaces of the third openings H3 of the second barrier layer 104 may protrude inwards farther than those of the second openings H2 of the second base layer 103. In other words, an edge of the inner lateral surface of each third opening H3 of the second barrier layer 104 may extend toward the center of the third opening H3 more than an edge of the inner lateral surface of a second opening H2 of the second base layer 103 that corresponds to, or that is adjacent to, the third opening H3. Here, "corresponds to" may refer to overlapping as viewed in a direction perpendicular to the upper surface of the first barrier layer 102. When viewed in the direction perpendicular to the upper surface of the first barrier layer 102, the area of each of the third openings H3 may be less than that of a second opening H2 that corresponds to each of the third openings H3.

Such an undercut structure, or eave structure, of each groove G may disconnect or separate at least some of, or portions of, the layers arranged over the second barrier layer 104. In other words, without performing a special mask process, at least some of the layers arranged over the second barrier layer 104 may be disconnected or separated in areas corresponding to the transmission areas TA. For example, the organic material layers arranged over the second barrier layer 104, for example, a first functional layer 222*a* and/or a second functional layer 222*c*, may be broken up by, or separated by, the second barrier layer 104. The first functional layer 222*a* and/or the second functional layer 222*c* may be formed by thermal deposition, and, during deposition, the first functional layer 222*a* and/or the second functional layer 222*c* may be discontinuously formed due to the undercut structure formed by the second openings H2 and the third openings H3.

Similarly, an auxiliary opposite electrode 223*a* may also be formed by thermal deposition, and may be discontinuously formed due to the undercut structures of the grooves G formed by the second openings H2 and the third openings H3. According to some embodiments, FIGS. 8, 9, and 13 through 16 illustrate the first functional layer 222*a*, the second functional layer 222*c*, and/or the auxiliary opposite electrode 223*a* broken up based on the second barrier layer 104 in the undercut structure formed by the second openings H2 and the third openings H3. Portions of the second functional layer 222*c* and/or the auxiliary opposite electrode 223*a* may be located on the first barrier layer 102 that is a bottom surface of the grooves G formed by the second openings H2 and the third openings H3.

According to some embodiments, a buffer layer may be located on the second barrier layer 104. The buffer layer may reduce or prevent infiltration of a foreign material, moisture, or ambient air from below the substrate 100, and may provide a flat surface to the upper surface of the substrate 100. The buffer layer may include an inorganic insulating material, such as silicon oxide, silicon oxynitride, or silicon nitride, and may be a single layer or multiple layers including the inorganic insulating material.

Auxiliary and main pixel circuits PCa and PCm including auxiliary and main thin-film transistors TFTa and TFTm and storage capacitors Cst may be above the second barrier layer 104. The main pixel circuit PCm may be in the first display area DA1, and the auxiliary pixel circuit PCa may be in the second display area DA2. The main pixel circuit PCm of the first display area DA1 and the auxiliary pixel circuit PCa of the second display area DA2 may have the same or similar structures.

According to some embodiments, a bottom metal layer may be between the auxiliary pixel circuit PCa arranged in the second display area DA2 and the substrate 100. The bottom metal layer may reduce or prevent diffraction of light emitted from the component 40, or heading toward the component 40, through a narrow gap between wires connected to the auxiliary pixel circuit PCa, and may improve the performance of the auxiliary thin-film transistor TFTa. The bottom metal layer may improve uniformity of reflectivity by removing a difference between reflectance of an area where wires and the like including a metal material are located, and reflectance of the other area. By adjusting a material included in the bottom metal layer, the bottom metal layer may have preset reflectance. For example, the bottom metal layer may include molybdenum (Mo), copper (Cu), and/or titanium (Ti). The bottom metal layer may be a single layer or multi-layer including the aforementioned materials. For example, the bottom metal layer may have a multi-layered structure of Mo/Cu/Mo, Ti/Cu/Ti, Ti/Cu/Ti/Cu, or the like.

The bottom metal layer might not exist in the transmission areas TA. For example, the bottom metal layer may have openings corresponding to the transmission areas TA. In other words, the openings of the bottom metal layer may define, or correspond to, the transmission areas TA of the second display area DA2. The bottom metal layer may be between the first barrier layer 102 and the second base layer 103. In this case, similarly, the bottom metal layer may have openings corresponding to the transmission areas TA.

The main thin-film transistor TFTm of the main pixel circuit PCm located in the first display area DA1 may include a main semiconductor layer A1, a main gate electrode G1 overlapping a channel region of the main semiconductor layer A1, and a source electrode S1 and a drain electrode D1 respectively connected to a source region and a drain region of the main semiconductor layer A1. A gate insulating layer 112 may be between the main semiconductor layer A1 and the main gate electrode G1, and a first interlayer insulating layer 113 and a second interlayer insulating layer 115 may be between the main gate electrode G1 and the source electrode S1 and/or between the main gate electrode G1 and the drain electrode D1.

The storage capacitor Cst and the main thin-film transistor TFTm may overlap each other. The storage capacitor Cst may include a lower electrode CE1 and an upper electrode CE2 overlapping each other. According to some embodiments, the main gate electrode G1 of the main thin-film transistor TFTm and the lower electrode CE1 of the storage capacitor Cst may be integrated or the same. The first interlayer insulating layer 113 may be between the lower electrode CE1 and the upper electrode CE2.

The main semiconductor layer A1 may include polysilicon. According to some embodiments, the main semiconductor layer A1 may include amorphous silicon. According to some embodiments, the main semiconductor layer A1 may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and/or zinc (Zn). The main semiconductor layer A1 may include a channel region, and a source region and a drain region doped with impurities.

The gate insulating layer 112 may include an inorganic insulating material, such as silicon oxide, silicon oxynitride, or silicon nitride, and may be a single layer or multiple layers including the inorganic insulating material.

The main gate electrode G1 or the lower electrode CE1 may include a low-resistance conductive material including molybdenum (Mo), aluminum (Al), copper (Cu), and/or titanium (Ti), and may have a multi-layer or single layer structure including the aforementioned materials. For example, the main gate electrode G1 may have a three-layered structure of Mo layer/Al layer/Mo layer.

The first interlayer insulating layer 113 may include an inorganic insulating material, such as silicon oxide, silicon oxynitride, or silicon nitride, and may be a single layer or multiple layers including the inorganic insulating material.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single layer or multi-layer structure including the aforementioned materials.

The second interlayer insulating layer 115 may include an inorganic insulating material, such as silicon oxide, silicon oxynitride, or silicon nitride, and may have a single layer or multi-layer structure including the inorganic insulating material.

The source electrode S1 or the drain electrode D1 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single layer or multi-layer structure including the aforementioned materials. For example, the source electrode S1 or the drain electrode D1 may have a three-layered structure of Ti layer/Al layer/Ti layer.

The main pixel circuit PCm including the main thin-film transistor TFTm and the storage capacitor Cst may be electrically connected to a main pixel electrode 221*m* located in the first display area DA1. For example, as shown in FIG. 5, the main pixel circuit PCm and the main pixel electrode 221*m* may be electrically connected to each other by a contact metal CM that is a connection line.

The contact metal CM may be on a first planarization layer 117, and may be connected to the main pixel circuit PCm through a contact hole formed in the first planarization layer 117. The contact metal CM may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single layer or multi-layer structure including the aforementioned materials.

The first planarization layer 117 may include an organic insulating material. The first planarization layer 117 may include an organic insulating material, such as acryl, benzocyclobutene (BCB), polyimide, or hexamethyldisiloxane (HMDSO). The organic insulating material of the first planarization layer 117 may be a photosensitive organic insulating material.

A second planarization layer 118 may be on the metal contact CM. The second planarization layer 118 may include an organic insulating material. The second planarization layer 118 may include an organic insulating material, such as acryl, benzocyclobutene (BCB), polyimide, or hexamethyldisiloxane (HMDSO). The organic insulating material of the second planarization layer 118 may be a photosensitive organic insulating material.

The main pixel electrode 221*m* may be on the second planarization layer 118. The main pixel electrode 221*m* may be connected to the contact metal CM through a contact hole of the second planarization layer 118.

The main pixel electrode 221*m* may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials.

The main pixel electrode 221*m* may include a reflective layer including this material, and a transparent conductive layer arranged above and/or below the reflective layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the main pixel electrode 221*m* may have a three-layered structure of ITO/Ag/ITO layers that are sequentially stacked.

Although the main pixel circuit PCm and the main pixel electrode 221*m* located in the first display area DA1 have been described up to now, this description may be equally applied to the auxiliary pixel circuit PCa and the auxiliary pixel electrode 221*a* located in the second display area DA2. In other words, the auxiliary thin-film transistor TFTa of the auxiliary pixel circuit PCa located in the second display area DA2 may have the same or similar structure as the main thin-film transistor TFTm of the main pixel circuit PCm, and the auxiliary pixel electrode 221*a* located in the second display area DA2 may have the same or similar structure as the main pixel electrode 221*m*. FIG. 5 illustrates that the auxiliary pixel electrode 221*a* is electrically connected to the auxiliary thin-film transistor TFTa having an auxiliary semiconductor layer and an auxiliary gate electrode by contact metal CM' that is a connection line. The above description of the contact metal CM may be applied to the contact metal CM'.

A pixel defining layer 119 may be arranged on the main pixel electrode 221*m* and the auxiliary pixel electrode 221*a*. The pixel defining layer 119 may cover the edges of the main pixel electrode 221*m* and the auxiliary pixel electrode 221*a*, and may include an opening 1190P overlapping with the center of each of the main pixel electrode 221*m* and the auxiliary pixel electrode 221*a*. The pixel defining layer 119 may include an organic insulating material, such as polyimide, polyamide, acryl resin, benzocyclobutene, hexamethyldisiloxane (HMDSO), or phenol resin.

The first functional layer 222*a* and the second functional layer 222*c* are located on the pixel defining layer 119, the main pixel electrode 221*m*, and the auxiliary pixel electrode 221*a*. Each of the first functional layer 222*a* and the second functional layer 222*c* may cover both the first display area DA1 and the second display area DA2, but may be broken up or segmented by the undercut structures of the grooves G formed by the second openings H2 and the third openings H3 in the transmission areas TA. Portions of the first functional layer 222*a* and the second functional layer 222*c* may be located on the first barrier layer 102 in the transmission areas TA, and may have isolated shapes.

The first functional layer 222*a* may be a single layer or multiple layers. For example, when the first functional layer 222*a* includes a high molecular organic material, the first functional layer 222*a* is a hole transport layer (HTL) having a single-layered structure, and may include poly-(3,4)-ethylene-dihydroxy thiophene (PEDOT) and/or polyaniline (PANI). When the first functional layer 222*a* includes a low molecular weight material, the first functional layer 222*a* may include a hole injection layer (HIL) and/or a hole transport layer (HTL).

The second functional layer 222*c* may be optional. For example, when the first functional layer 222*a* includes a high molecular organic material, the second functional layer 222*c* may be located over the first functional layer 222*a*. The second functional layer 222*c* may be a single layer or multiple layers. The second functional layer 222*c* may include an electron transport layer (ETL) and/or an electron injection layer (EIL).

A main emission layer 222*mb* or an auxiliary emission layer 222*ab* is located on the first functional layer 222*a* or between the first functional layer 222*a* and the second functional layer 222*c*. The main emission layer 222*mb* may have a shape patterned in correspondence with the main pixel electrode 221*m*, and the auxiliary emission layer 222*ab* may have a shape patterned in correspondence with the auxiliary pixel electrode 221*a*. The main emission layer 222*mb* and the auxiliary emission layer 222*ab* may include an organic material. The main emission layer 222*mb* and the auxiliary emission layer 222*ab* may include a high molecular or low molecular organic material that emits light of a corresponding color.

A first auxiliary opposite electrode as a portion of an auxiliary opposite electrode 223*a* overlapping the auxiliary pixel electrode 221*a* is located over the auxiliary emission layer 222*ab*, and the main opposite electrode 223*m* overlapping the main pixel electrode 221*m* is located over the main emission layer 222*mb*. The first auxiliary opposite electrode as a portion of the auxiliary opposite electrode 223*a* may be integral with the main opposite electrode 223*m*.

The first auxiliary opposite electrode as a portion of the auxiliary opposite electrode 223*a* may have fourth openings H4 overlapping the transmission areas TA. The respective fourth openings H4 overlap the second openings H2 and the third openings H3. The fourth openings H4 may be formed by the first auxiliary opposite electrode as a portion of the auxiliary opposite electrode 223*a* being broken up by the undercut structures of the grooves G formed by the second openings H2 and the third openings H3, and the auxiliary opposite electrode 223*a* thus not existing in the transmission areas TA. A second auxiliary opposite electrode as the remaining portion of the auxiliary opposite electrode 223*a* may be located on the first barrier layer 102 to face the fourth openings H4. The second auxiliary opposite electrode as the remaining portion of the auxiliary opposite electrode 223*a* may have an isolated shape. The first auxiliary opposite electrode and the second auxiliary opposite electrode may have the same layer structures.

The auxiliary opposite electrode 223*a* and the main opposite electrode 223*m* may include a conductive material having a relatively low work function. For example, the auxiliary opposite electrode 223*a* and the main opposite electrode 223*m* may include a (semi)transparent material layer including, for example, silver (Ag), magnesium (Mg), aluminum (Al), nickel (Ni), chromium (Cr), lithium (Li), calcium (Ca), or an alloy of these materials. Alternatively, the auxiliary opposite electrode 223*a* and the main opposite electrode 223*m* may further include a layer, such as ITO, IZO, ZnO, or $In_2O_3$, on the (semi)transparent material layer including any of the above-described materials. According to some embodiments, the auxiliary opposite electrode 223*a* and the main opposite electrode 223*m* may include silver (Ag) and/or magnesium (Mg).

The main pixel electrode 221*m*, the main emission layer 222*mb*, and the main opposite electrode 223*m* sequentially stacked on one anther may form a light-emitting diode, for example, an organic light-emitting diode (OLED). The auxiliary pixel electrode 221*a*, the auxiliary emission layer 222*ab*, and the auxiliary opposite electrode 223*a* sequentially stacked on one anther may form a light-emitting diode, for example, an organic light-emitting diode (OLED). The organic light-emitting diode (OLED) may emit red light, green light, or blue light, and a light-emission region of each organic light-emitting diode (OLED) corresponds to a pixel. For example, the main subpixel Pm corresponds to the light-emission region of the organic light-emitting diode (OLED) arranged in the first display area DA1, and the auxiliary subpixel Pa corresponds to the light-emission region of the organic light-emitting diode (OLED) arranged in the second display area DA2. Because the opening 1190P of the pixel defining layer 119 defines the size and/or width of the light-emission region, the size and/or width of the main subpixel Pm and the size and/or width of the auxiliary subpixel Pa may depend on the opening 1190P of the pixel defining layer 119.

As described above, the organic light-emitting diode (OLED) may be covered with the encapsulation layer 300 including the first inorganic encapsulation layer 310, the second inorganic encapsulation layer 330, and the organic encapsulation layer 320 between the first and second inorganic encapsulation layers 310 and 330. In detail, the encapsulation layer 300 may consecutively cover the main pixel electrodes 221*m*, the auxiliary pixel electrodes 221*a*, the respective inner lateral surfaces of the third openings H3, and the respective inner lateral surfaces of the second openings H2. The phrase "consecutively cover" refers to being integrally formed without disconnection.

Referring to the transmission areas TA of FIG. 8, each of the insulating layers on the substrate 100 may include holes respectively formed in the transmission areas TA. For example, as shown in FIG. 8, the gate insulating layer 112, the first interlayer insulating layer 113, the second interlayer insulating layer 115, the first planarization layer 117, the second planarization layer 118, and the pixel defining layer 119 may include respective holes located in the transmission areas TA and overlapping each other.

Figure 9:
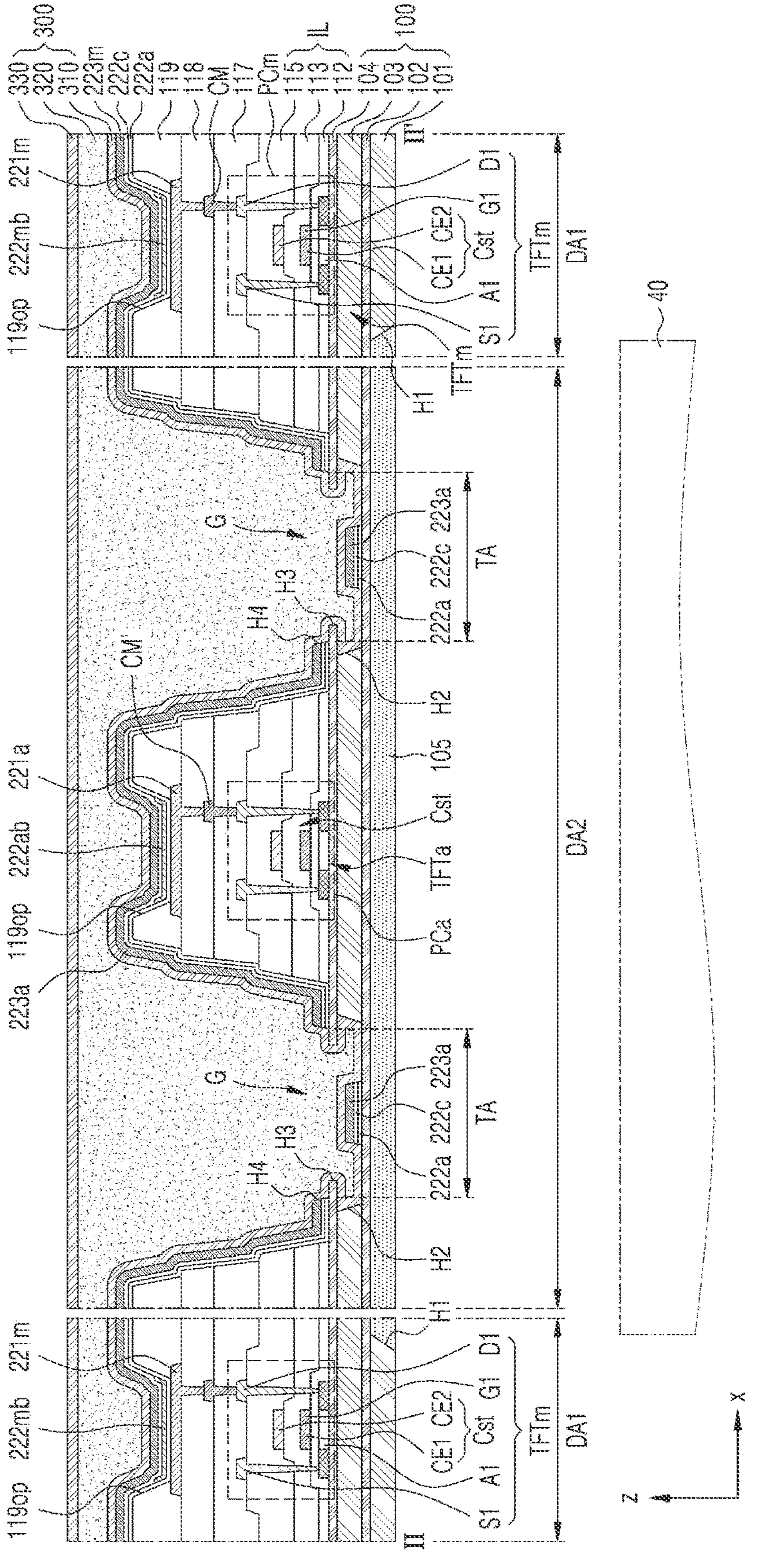
FIG. 9 is a schematic cross-sectional view of a portion of a display apparatus according to some embodiments.

FIG. 9 is a schematic cross-sectional view of a portion of a display apparatus according to some embodiments. Hereinafter, the same reference numerals in the drawings indicate the same components, and repeated descriptions thereof will be omitted.

Referring to FIG. 9, the display apparatus according to some embodiments may further include a transparent layer 105.

The transparent layer 105 may be located on a lower surface of the first barrier layer 102, and may correspond to the first opening H1 formed in the first base layer 101. In other words, the transparent layer 105 may fill the first opening H1 and may be located to overlap the first opening H1. According to some embodiments, the transparent layer 105 may planarize a lower surface of the substrate 100. A lower surface of the transparent layer 105 might not form a step with a lower surface of the first base layer 101. In detail, a distance from the lower surface of the first barrier layer 102 to the lower surface of the transparent layer 105 may be equal to a distance from the lower surface of the first barrier layer 102 to the lower surface of the first base layer 101. By planarizing the lower surface of the substrate 100 through the transparent layer 105 as described above, the panel protection member PB may be more stably arranged below the substrate 100 during the manufacture of the display apparatus, and durability of the lower surface of the substrate 100 may be improved during the use of the display apparatus after the manufacture thereof.

FIGS. 10 through 15 are cross-sectional views illustrating a method of manufacturing a display apparatus, according to some embodiments.

Although not illustrated in FIGS. 10 through 14, the substrate 100 may be arranged on a carrier substrate in other embodiments to perform the processes illustrated in FIGS. 10 through 15. In some cases, the carrier substrate may be removed right before the process of FIG. 15.

Figure 10:
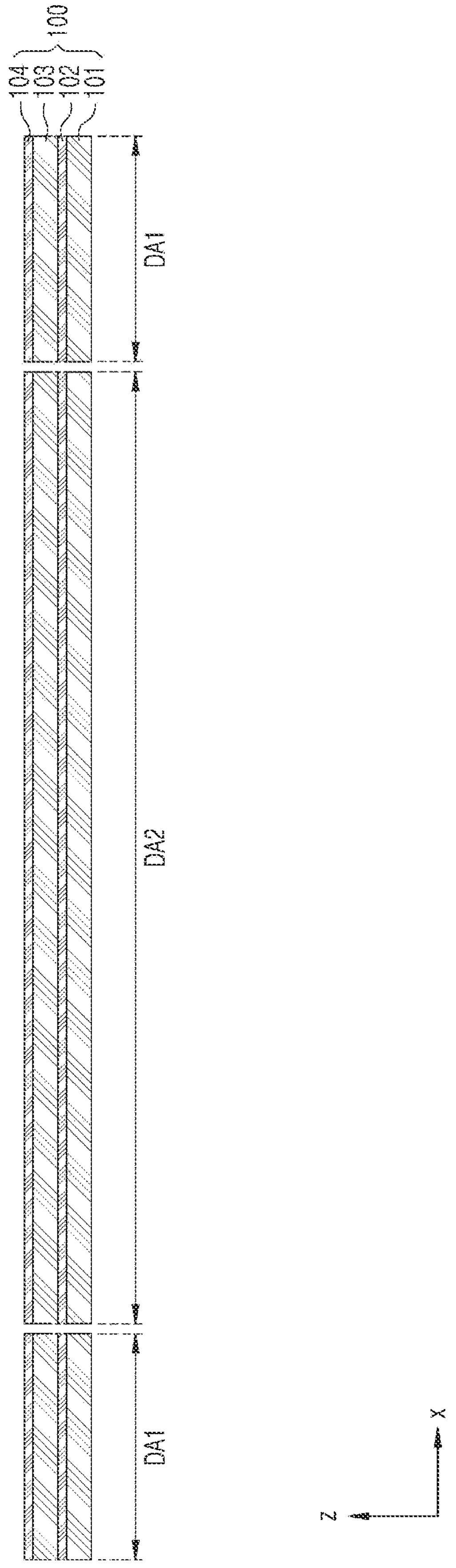
FIGS. 10 through 15 are cross-sectional views illustrating a method of manufacturing a display apparatus, according to some embodiments.

First, as shown in FIG. 10, the substrate 100 including multiple layers is formed. In detail, the first base layer 101, the first barrier layer 102 on the first base layer 101, the second base layer 103 on the first barrier layer 102, and the second barrier layer 104 on the second base layer 103 are sequentially formed.

Figure 11:
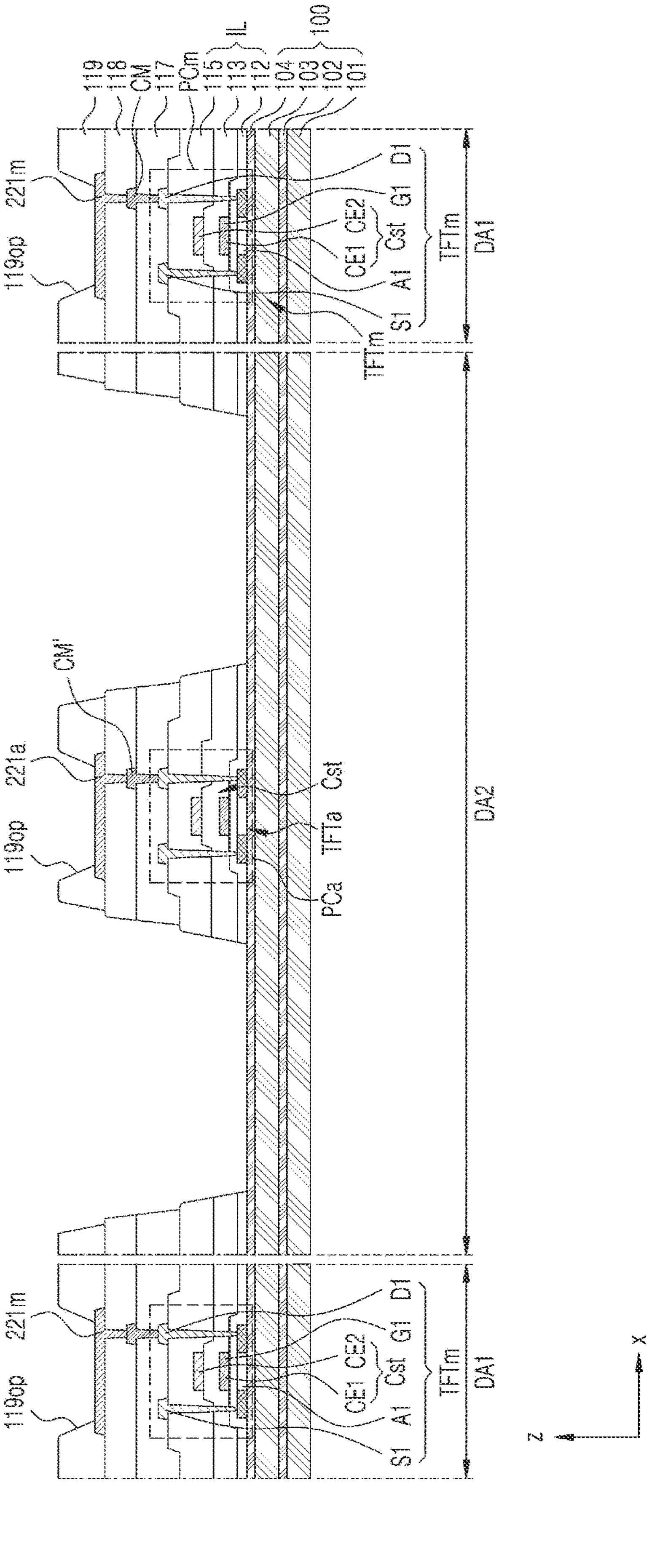

Then, as shown in FIG. 11, the main pixel circuit PCm and the main pixel electrode 221*m* electrically connected thereto are formed over the second barrier layer 104 of the first display area DA1 of the substrate 100, and the auxiliary pixel circuit PCa and the auxiliary pixel electrode 221*a* electrically connected thereto are formed over the second barrier layer 104 between the transmission areas TA included in the second display area DA2 of the substrate 100. The pixel defining layer 119 is formed to define the light-emission regions of the first display area DA1 and the second display area DA2. The pixel defining layer 119 may cover the edges of the main pixel electrode 221*m* and the auxiliary pixel electrode 221*a*, and may include the opening 1190P overlapping with the center of each of the main pixel electrode 221*m* and the auxiliary pixel electrode 221*a*.

Figure 12:
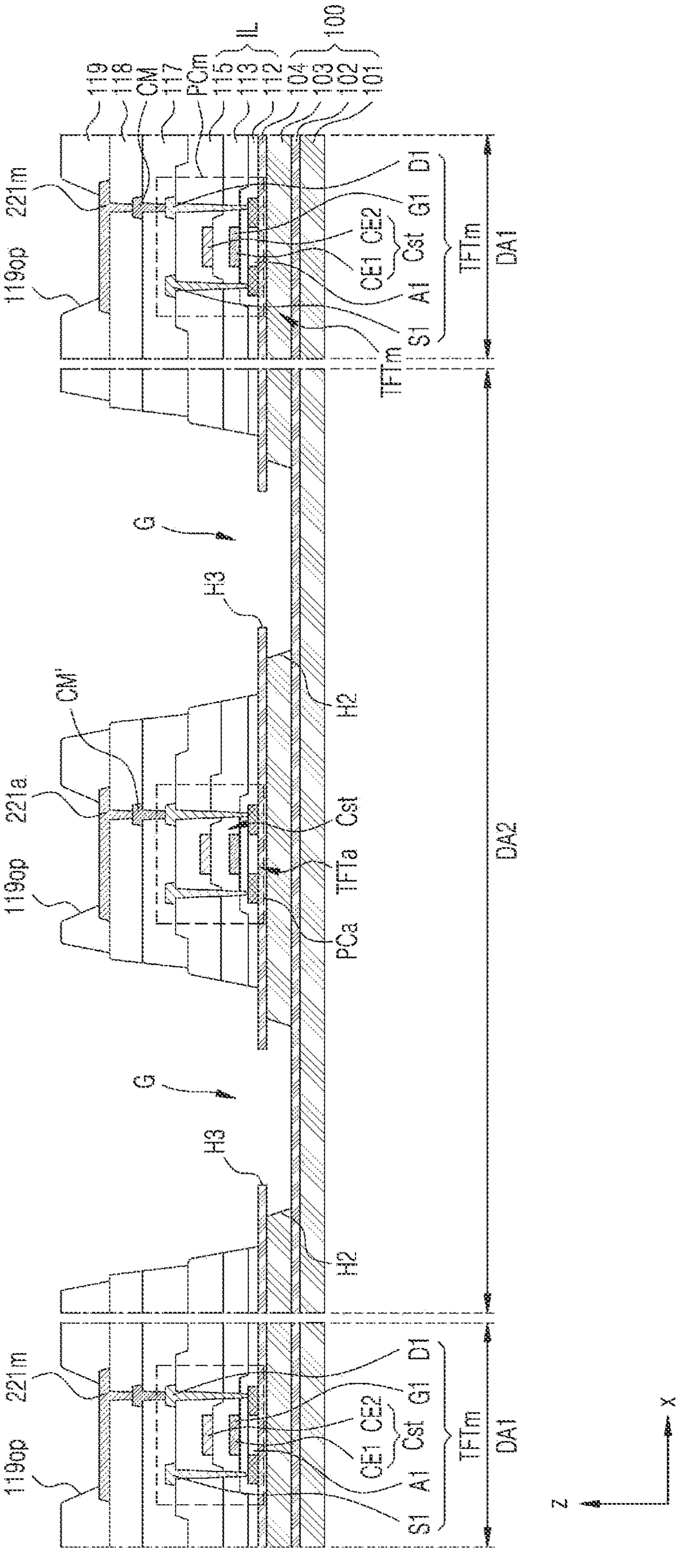

Then, as shown in FIG. 12, the second openings H2 of the second base layer 103 are formed to overlap the transmission areas TA, and the third openings H3 of the second barrier layer 104 are formed to overlap the second openings H2. The grooves G may be formed between the second openings H2 and the third openings H3 and may each have an undercut structure (or an eave structure). The grooves G may be formed via etching, e.g., isotropic etching. In detail, portions of the second barrier layer 104 that correspond to the transmission areas TA are removed by sequentially performing a mask process and an etching process with respect to the second barrier layer 104. Then, portions of the second base layer 103 that correspond to the transmission areas TA are removed by performing isotropic etching by using the second barrier layer 104 as a mask. Due to the isotropic etching, a portion of the second base layer 103 that overlaps the second barrier layer 104 may be partially more etched than the second barrier layer 104 is etched, and thus the undercut structure (or the eave structure) may be formed.

Figure 13:
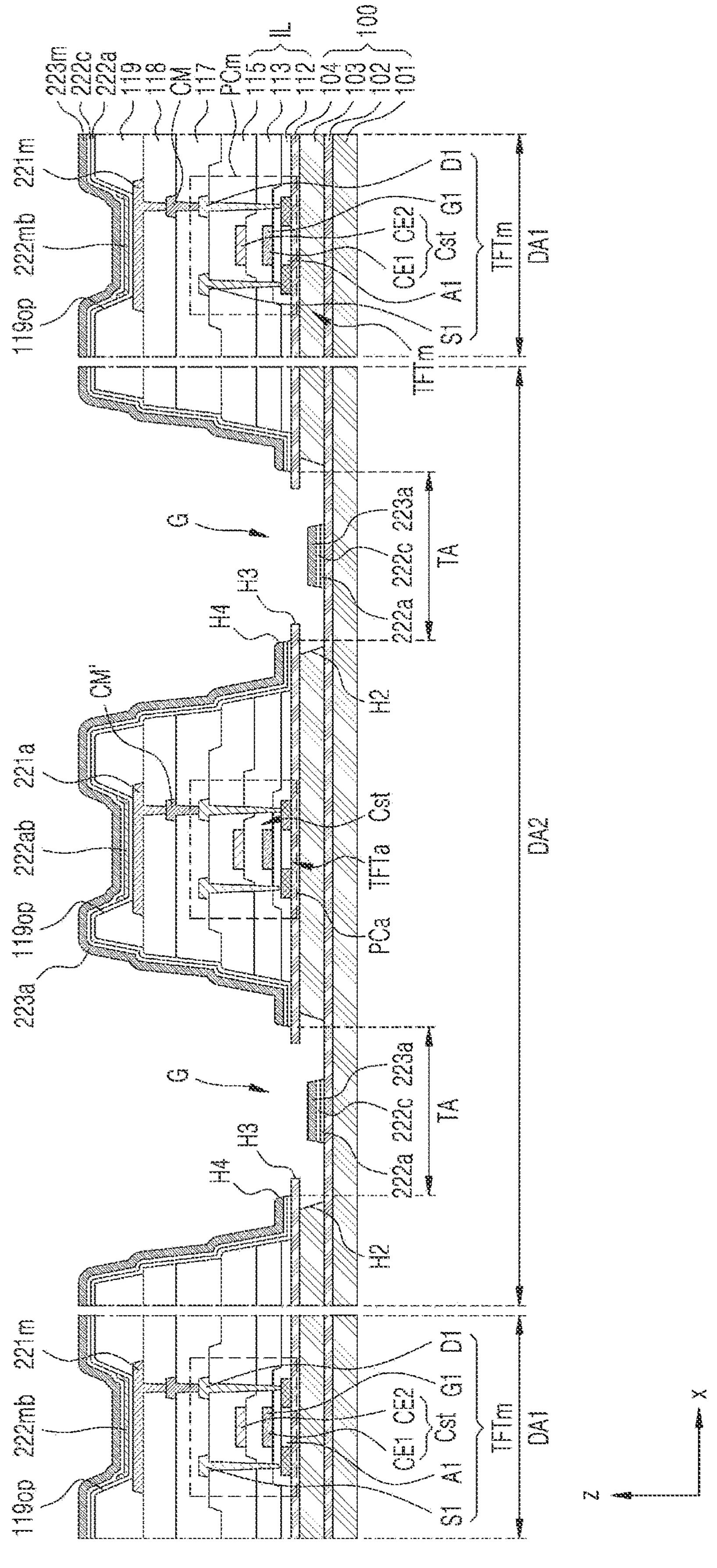

Then, as shown in FIG. 13, the main emission layer 222*mb* and the main opposite electrode 223*m* overlapping the main pixel electrodes 221*m* are formed over the main pixel electrodes 221*m*. At this time, the first functional layer 222*a* may be interposed between the main pixel electrodes 221*m* and the main emission layer 222*mb*, and the second functional layer 222*c* may be interposed between the main emission layer 222*mb* and the main opposite electrode 223*m*. The auxiliary emission layer 222*ab* and the auxiliary opposite electrode 223*a* overlapping the auxiliary pixel electrodes 221*a* are formed over the auxiliary pixel electrodes 221*a*. At this time, the first functional layer 222*a* may be interposed between the auxiliary pixel electrodes 221*a* and the auxiliary emission layer 222*ab*, and the second functional layer 222*c* may be interposed between the auxiliary emission layer 222*ab* and the auxiliary opposite electrode 223*a*.

The auxiliary opposite electrode 223*a* may be broken up by the undercut structures of the grooves G formed by the second openings H2 and the third openings H3. In other words, the auxiliary opposite electrode 223*a* may include a first auxiliary opposite electrode overlapping the auxiliary pixel electrodes 221*a* and having the fourth openings H4 overlapping the transmission areas TA. The auxiliary opposite electrode 223*a* may include second auxiliary opposite electrodes located on the first barrier layer 102 to correspond to the fourth openings H4.

The first functional layer 222*a* and the second functional layer 222*c* located in the second display area DA2 may be formed to overlap the first auxiliary opposite electrode and the second auxiliary opposite electrodes included in the auxiliary opposite electrode 223*a*.

Figure 14:
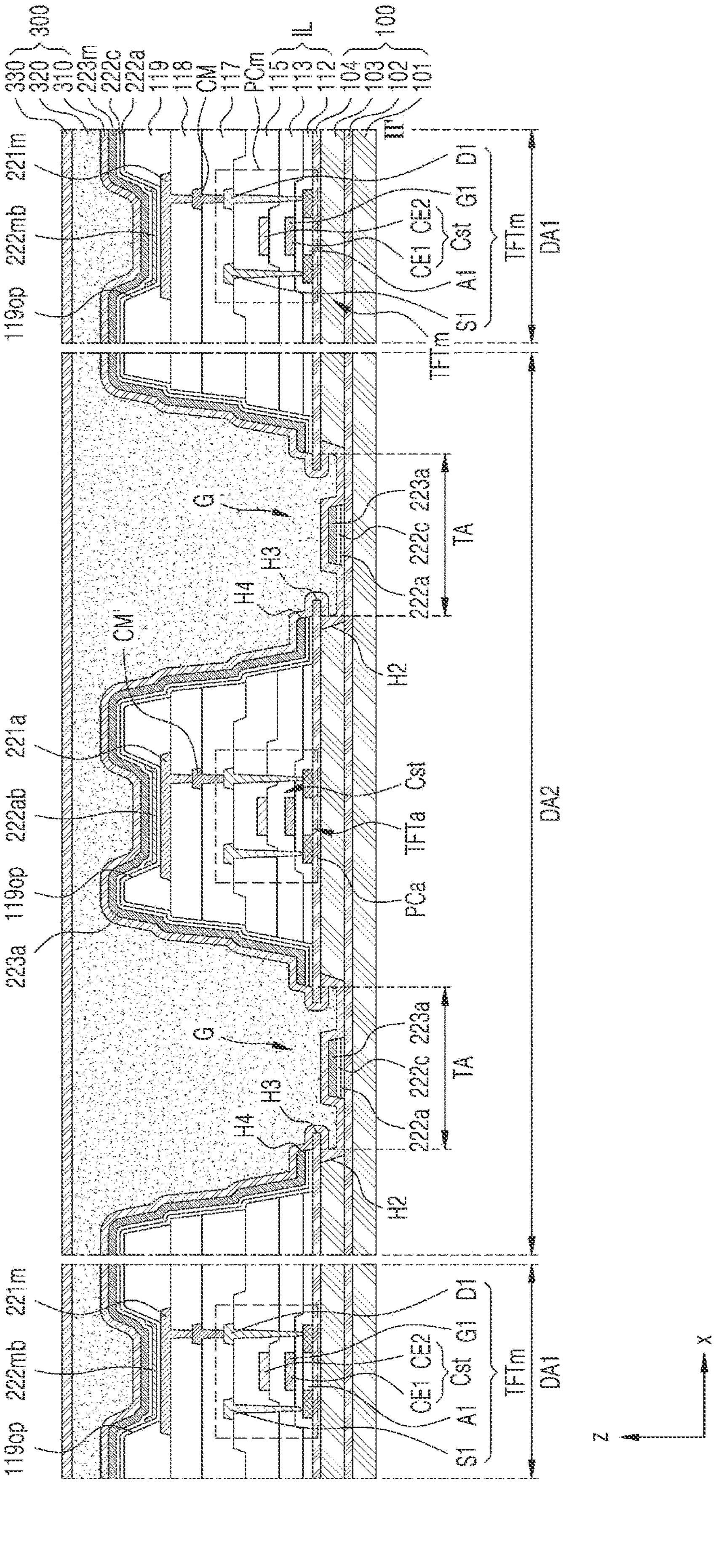

Then, as shown in FIG. 14, the encapsulation layer 300 is formed to cover all of the main opposite electrode 223*m* and the auxiliary opposite electrode 223*a*. The encapsulation layer 300 may include the first inorganic encapsulation layer 310, the organic encapsulation layer 320, and the second inorganic encapsulation layer 330 sequentially stacked on one another.

The first inorganic encapsulation layer 310 may consecutively cover the main pixel electrodes 221*m*, the auxiliary pixel electrodes 221*a*, the inner lateral surface of the second barrier layer 104, and the inner lateral surface of the second base layer 103. In detail, the first inorganic encapsulation layer 310 located on the main opposite electrode 222*m* covers the respective inner lateral surfaces of the fourth openings H4, the respective inner lateral surfaces of the third openings H3, the respective inner lateral surfaces of the second openings H2, respective bottom surfaces of the grooves G, and respective upper surfaces of the auxiliary opposite electrodes 223*a*, and is integrally formed. In other words, the first inorganic encapsulation layer 310 might not be broken up by the undercut structures of the grooves G but may consecutively cover the respective inner lateral surfaces and respective bottom surfaces of the grooves G, in contrast with the auxiliary opposite electrode 223*a*. To this end, the first inorganic encapsulation layer 310 may include a material having a higher step coverage than the auxiliary opposite electrode 223*a*.

Although not illustrated in FIG. 14, one or more functional layers such as the touch screen layer TSL and the optical functional layer OFL may be formed on the encapsulation layer 300.

Figure 15:
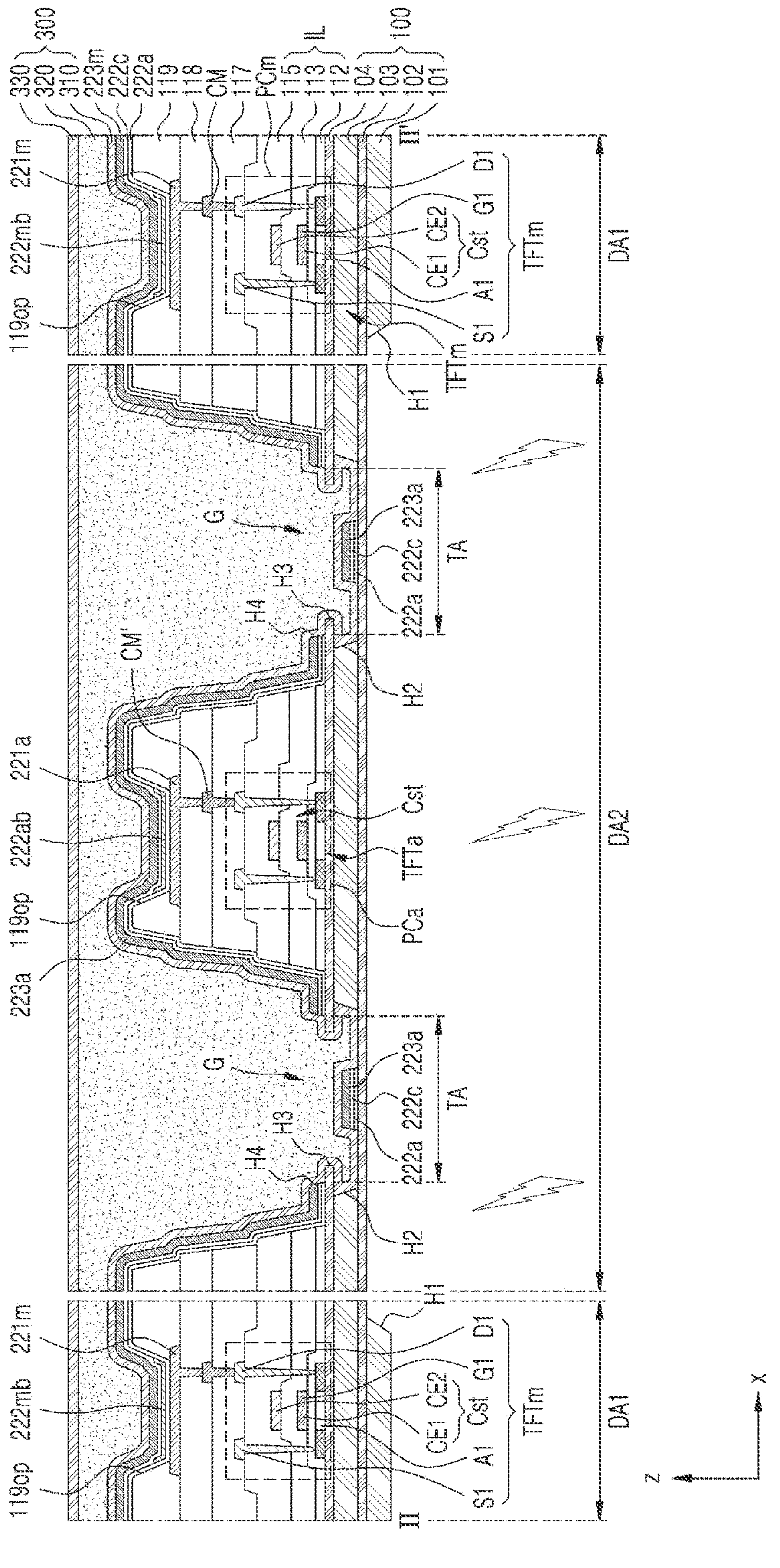

Then, as shown in FIG. 15, the first opening H1 of the first base layer 101 is formed to overlap the second display area DA2.

According to some embodiments, the first opening H1 may be formed using a laser process. In detail, the first base layer 101 is removed by applying laser energy to an area of the first base layer 101 where the first opening H1 is to be formed. At this time, by adjusting the intensity of a laser, damage to the first barrier layer 102 may be prevented or reduced during the laser process. For example, the first base layer 101 including an organic material may be removed by smaller energy than the first barrier layer 102 including an inorganic material. Accordingly, only the first base layer 101 may be removed without damage to the first barrier layer 102 by adjusting the intensity of laser between an intensity necessary for removing the first base layer 101 including an organic material and an intensity necessary for removing the first barrier layer 102 including an inorganic material. For example, a 340 nanosecond laser (approximately) or 515 nanosecond laser (approximately) may be applied.

A $CO_2$ laser, a YAG laser, a nanosecond laser, a femtosecond laser, a Bessel beam, or a Gaussian beam may be applied as a laser used in such a laser process, but embodiments are not limited thereto. In some cases, the carrier substrate may be removed to perform the above-described laser process.

Figure 16:
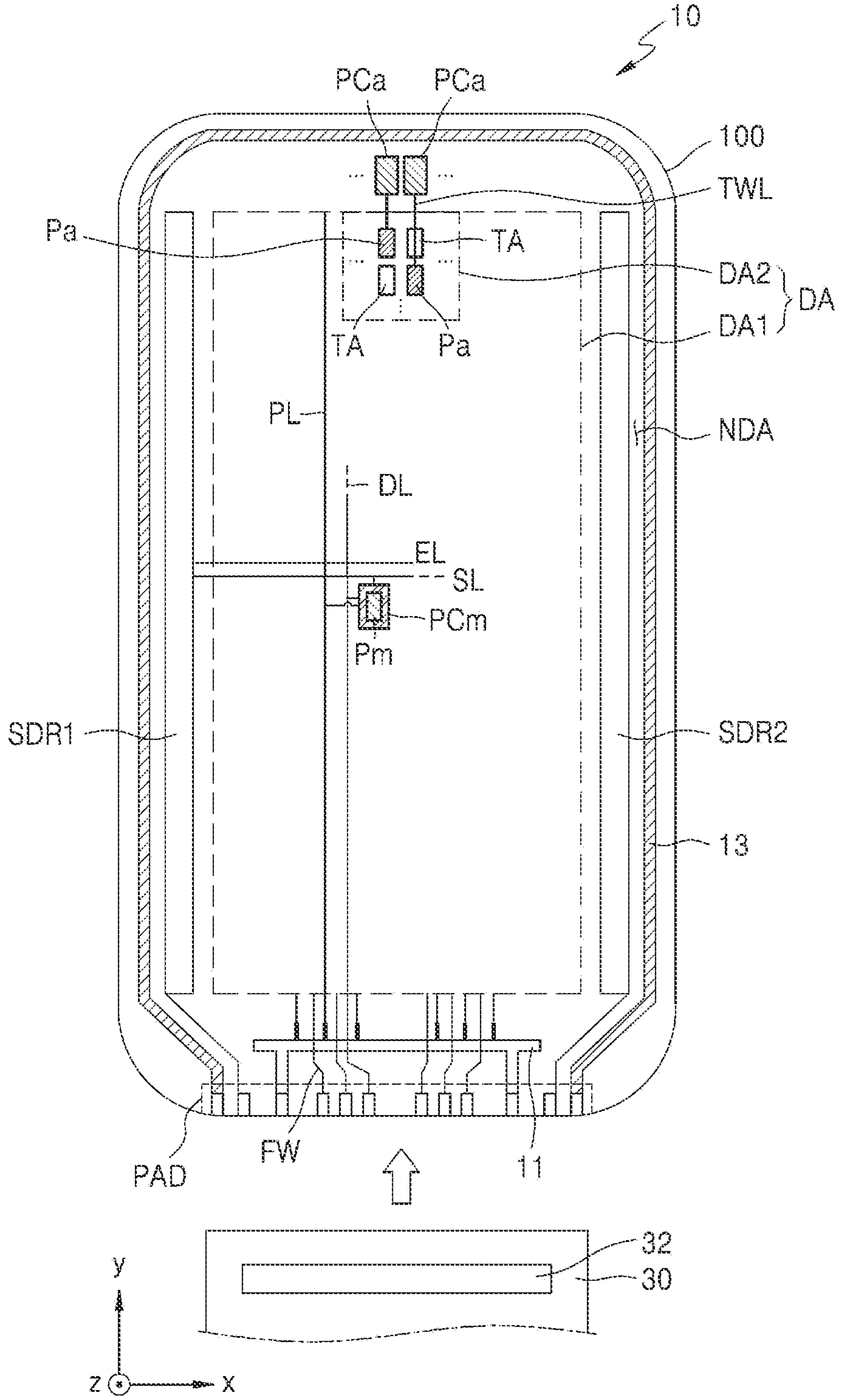
FIG. 16 is a schematic plan view of a display panel included in a display apparatus, according to some embodiments.
Figure 17:
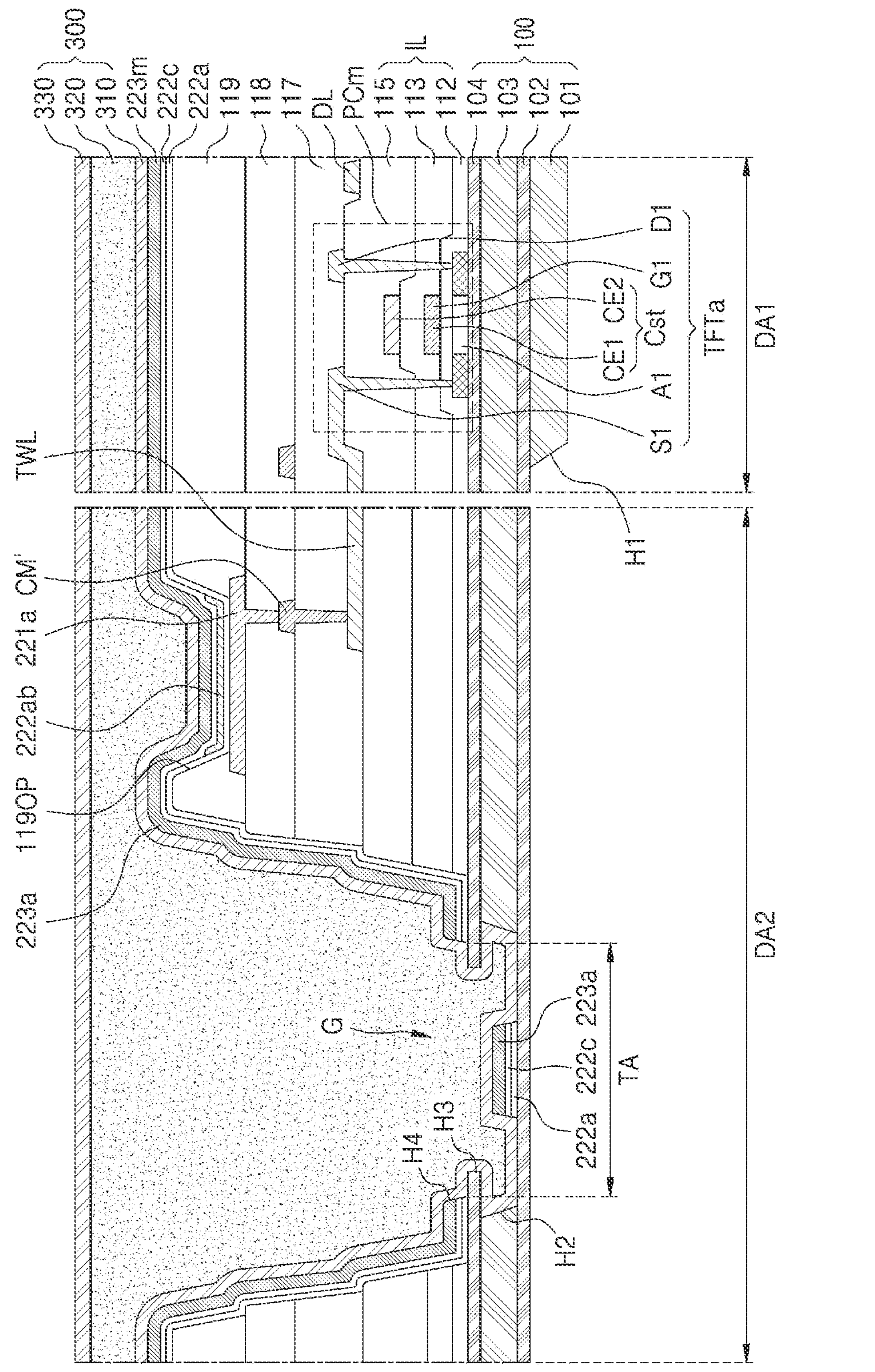
FIG. 17 is a schematic cross-sectional view of a portion of a display apparatus according to some embodiments.

FIG. 16 is a schematic plan view of a display panel 10 included in a display apparatus according to some embodiments, and FIG. 17 is a schematic cross-sectional view of a portion of the display apparatus according to some embodiments.

Although a case where an auxiliary pixel circuits PCa, which are electrically connected to auxiliary subpixels Pa within the second display area DA2, are located within the second display area DA2 has been described up to now, embodiments are not limited thereto. In other words, as shown in FIG. 16, the auxiliary pixel circuits PCa electrically connected to the auxiliary subpixels Pa located within the second display area DA2 may be located in the non-display area NDA. Each of the auxiliary pixel circuits PCa may have an auxiliary thin-film transistor including an auxiliary semiconductor layer and an auxiliary gate electrode.

Also in this case, a plurality of main subpixels Pm are arranged in the first display area DA1. Main pixel circuits PCm that drive the main subpixels Pm may be arranged in the first display area DA1, and may be overlapped by the main subpixels Pm. Auxiliary pixel circuit PCa driving the plurality of auxiliary subpixels Pa of the second display area DA2 may be arranged in the non-display area NDA adjacent to the second display area DA2. In detail, main thin-film transistors TFTm of FIG. 8 electrically connected to the main pixel electrodes 221*m*, and each including a main semiconductor layer and a main gate electrode, may be located on the second barrier layer 104 in the first display area DA1, and auxiliary thin-film transistor TFTa of FIG. 17, each including an auxiliary semiconductor layer and an auxiliary gate electrode, may be located on the second barrier layer 104 in the non-display area NDA. Connection lines TWL of FIG. 17 electrically connecting the auxiliary thin-film transistors TFTa to the auxiliary pixel electrodes 221*a* may be included.

When the second display area DA2 is arranged in an upper portion of the display area DA (in a +y direction) as in FIG. 3, the auxiliary pixel circuit PCa may be arranged in the non-display area NDA. An auxiliary pixel circuit PCa and a display device that implements an auxiliary subpixel Pa may be connected to each other via a connection line TWL extending in one direction (e.g., a y direction). Although the auxiliary pixel circuits PCa are located directly above the second display area DA2 in FIG. 16, embodiments are not limited thereto. For example, the auxiliary pixel circuits PCa may be located on the left side (in a −x direction) or the right side (in a +x direction) of the first display area DA1.

When the auxiliary pixel circuits PCa electrically connected to the auxiliary subpixels Pa located in the second display area DA2 are located in the non-display area NDA, as described above, the auxiliary pixel electrodes 221*a* may be connected to the auxiliary pixel circuits PCa located in the non-display area NDA through the connection lines TWL.

According to some embodiments, referring to FIG. 17, the connection line TWL may include the same material as a source electrode S1 of the auxiliary pixel circuit PCa, and may have the same layer structure as the source electrode S1. In other words, the connection line TWL may be formed by the source electrode S1 on the non-display area NDA extending from the non-display area NDA to the second display area DA2. The connection line TWL is not limited to the above-described example, but may include a plurality of connection lines. When the plurality of connection lines are arranged on different layers, the plurality of connection lines may be connected to one another via contact holes. The connection line TWL may include a different material from the auxiliary pixel electrode 221*a* and may have a different layer structure from the auxiliary pixel electrode 221*a*.

According to some embodiments as described above, a display apparatus including a transmission area having improved transmittance, and a method of manufacturing the same may be provided. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A method of manufacturing a display apparatus, the method comprising:

forming main pixel electrodes over a second barrier layer of a first display area of a substrate, the substrate having a first barrier layer, a first base layer on a lower surface of the first barrier layer, a second base layer on an upper surface of the first barrier layer, and the second barrier layer on an upper surface of the second base layer;

forming auxiliary pixel electrodes over the second barrier layer between transmission areas in a second display area of the substrate;

forming second openings in the second base layer that overlap the transmission areas;

forming third openings in the second barrier layer that overlap the second openings; and forming a first opening in the first base layer that overlaps the second display area, wherein the first opening overlaps the transmission areas and the auxiliary pixel electrodes in a plan view.

2. The method of claim 1, wherein the forming the first opening comprises-applying laser energy to a lower surface of the first base layer.

3. The method of claim 1, further comprising:

forming a main opposite electrode overlapping the main pixel electrodes, over the main pixel electrodes; and forming a first auxiliary opposite electrode overlapping the auxiliary pixel electrodes, and defining fourth openings overlapping the transmission areas, over the auxiliary pixel electrodes.

4. The method of claim 3, wherein respective inner lateral surfaces of the third openings protrude inwardly more than respective inner lateral surfaces of the second openings.

5. The method of claim 4, wherein, as viewed in a direction perpendicular to the upper surface of the first barrier layer, an area of each of the third openings is less than an area of each of the second openings.

6. The method of claim 1, further comprising forming an encapsulation layer that covers the main pixel electrodes, the auxiliary pixel electrodes, respective inner lateral surfaces of the third openings, and respective inner lateral surfaces of the second openings.

7. The method of claim 1, wherein the first base layer comprises an opaque material.

* * * * *